US006946934B2

(12) United States Patent
Kanno

(10) Patent No.: US 6,946,934 B2
(45) Date of Patent: Sep. 20, 2005

(54) TRANSMISSION LINE AND SEMICONDUCTOR INTEGRATED CIRCUIT DEVICE

(75) Inventor: Hiroshi Kanno, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/736,627

(22) Filed: Dec. 17, 2003

(65) Prior Publication Data

US 2004/0124942 A1 Jul. 1, 2004

Related U.S. Application Data

(63) Continuation of application No. PCT/JP03/09784, filed on Aug. 1, 2003.

(30) Foreign Application Priority Data

Aug. 1, 2002 (JP) ....................................... 2002-224651

(51) Int. Cl.[7] ............................. H01P 1/162; H01P 1/26

(52) U.S. Cl. ........................ 333/238; 333/172; 333/246; 333/33

(58) Field of Search ................................ 333/238, 246, 333/247, 172, 32, 33

(56) References Cited

U.S. PATENT DOCUMENTS 5,420,553 A * 5/1995 Sakamoto et al. .......... 333/172

FOREIGN PATENT DOCUMENTS

| | | | |
|---|---|---|---|
| JP | 1-233812 | A | 9/1989 |
| JP | 4-192902 | A | 7/1992 |
| JP | 5-29834 | A | 2/1993 |
| JP | 9-275001 | A | 10/1997 |
| JP | 11-261301 | A | 9/1999 |
| JP | 2001-177305 | A | 6/2001 |
| JP | 2002-171105 | A | 6/2002 |

OTHER PUBLICATIONS

Machine translation for JP2002–171105.*

Chen, T.H., et al. "One Watt Q–band Class A Pseudomorphic HEMT MMIC Amplifier." 1994, IEEE, MTT–S Digest, pp. 805–808.

* cited by examiner

*Primary Examiner*—Stephen E. Jones

(74) *Attorney, Agent, or Firm*—McDermott Will & Emery LLP

(57) ABSTRACT

The transmission line is provided with a signal strip, a resistive layer opposed to the signal strip across a dielectric layer, and a ground conductor electrically connected to the resistive layer, wherein, in the case where resistance per unit length occurring when a high frequency current induced in the resistive layer through capacitance formed by the dielectric layer between the signal strip and the resistive layer flows in the resistive layer and between the resistive layer and the ground conductor at the time of transmission of a high frequency signal of a predetermine frequency through the signal strip is defined as additional resistance and resistance per unit length occurring when the high frequency current flows through the ground conductor is defined as ground resistance, the additional resistance is larger than the ground resistance.

12 Claims, 16 Drawing Sheets

TRANSMISSION LINE AND SEMICONDUCTOR INTEGRATED CIRCUIT DEVICE

This is a continuation application under 35 U.S.C 111(a) of pending prior International Application No. PCT/JP03/09784, filed on Aug. 1, 2003.

BACKGROUND OF THE INVENTION

1. Field of the Invention

The present invention relates to a transmission line for handling high frequency signals in a microwave band, a millimeter wave band and the like and a semiconductor integrated circuit device having the transmission line.

2. Description of the Related Art

In a conventional communication apparatus using high frequency signals in a microwave band, a millimeter wave band, and the like as carrier waves, a transmission line such as a microstrip and a coplanar waveguide has generally been used as a bias supplying circuit for supplying power to an active device.

FIGS. 22A and 22B are schematic sectional views respectively showing a structure of an ordinary microstrip and a structure of an ordinary coplanar waveguide.

As shown in FIG. 22A, the microstrip has a dielectric substrate 101, a signal strip 102 disposed on a top face of the dielectric substrate 101, a ground conductor layer 103 disposed on a bottom face of the dielectric substrate 101 as opposed to the signal strip 102 with the dielectric substrate 101 disposed between the ground conductor layer 103 and the signal strip 102.

As shown in FIG. 22B, the coplanar waveguide has a dielectric substrate 101, a signal strip 102 disposed on a top face of the dielectric substrate 101, a pair of ground conductor layers 104 disposed on a bottom face of the dielectric substrate 101 in such a manner as to face the signal strip 102 with a predetermined spacing in the width direction of the signal strip 102.

To a main signal circuit of the communication apparatus, an arbitrary number of bias terminals for supplying a common voltage to the main signal circuit are electrically connected through the bias supplying circuit having the transmission line shown in FIG. 22A or FIG. 22B. The communication apparatus is typically composed of a microwave monolithic integrated circuit (hereinafter abbreviated as "MMIC") that is a semiconductor integrated circuit wherein a transmission line, an active element, a passive element and the like are provided on its common dielectric substrate and peripheral circuits accompanying the MMIC.

In general, in a module used as the communication apparatus, it is necessary to transmit the carrier waves efficiently. Accordingly, in regions of the MMIC and the peripheral circuits where the carrier waves are transmitted, it is necessary that the dielectric substrate constituting the circuits is formed from a low loss material and the signal strip is formed from a high conductivity (low resistance) material.

In a known MMIC, gallium arsenide which is the low loss material is used as a dielectric substrate material, and a transmission line, an active element, a passive element, and the like are disposed on a common dielectric substrate made of such material.

FIG. 23 is a circuit diagram showing a circuit structure at the output side of a module functioning as a high frequency amplifier that is a first prior art. In the module shown in the figure, the MMIC is provided with a main signal circuit 110 having an active element 111, an output terminal Tout, main signal lines 112*a* and 112*b* for electrically connecting the active element 111 and the output terminal Tout to each other, and a DC blocking capacitor 118. In the main signal circuit 110 of the MMIC thus-constituted, an input signal received by an input unit (not shown) is amplified by the active element 111 and then an output signal from the active element is outputted from the output terminal Tout through the main signal lines 112*a* and 112*b*. The MMIC is further provided with a short stub 113 branching from a portion between the main signal lines 112*a* and 112*b* and a first bypass condenser 114 disposed between the short stub 113 and a ground conductor. Further, the module itself is provided with a bias supplying circuit 120A for supplying a power voltage to the MMIC, and the bias supplying circuit 120A is provided with a bias terminal Tvd for supplying a DC power voltage, transmission lines 115 and 116 connected serially, and a second bypass condenser 117 disposed between a node of the transmission lines 115 and 116 and the ground conductor.

Here, the short stub 113 functions as a part of the bias supplying circuit 120A as well as a matching circuit for the main signal circuit 110 in the RF (Radio Frequency) band. A capacitance value C1 of the first bypass condenser 114 is set to such a value that a high frequency signal included in the design frequency band is short-circuited. A capacitance value C2 of the second bypass condenser 117 is set to such a large value at which a high frequency signal included in a low frequency band is short-circuited, the second bypass condenser 117 being an external type chip condenser in this prior art.

In general, in the communication apparatus, the high frequency signal may leak to the bias supplying circuit 120A if the high frequency signal is not short-circuited in the bias supplying passage (bias supplying circuit 120A) from the main signal circuit 110 to the bias terminal Tvd. For example, a parasitic oscillation may occur in a multistage amplifier in the case where connection of the transmission line constituting the bias supplying circuit is in such a fashion that it causes a positive feed back from a rear stage amplifier to a front stage amplifier. Therefore, in the module shown in FIG. 23, the bypass condensers 114 and 117 are provided between the ground conductor and both ends of the transmission line 115 which is a part of the transmission line constituting the bias supplying line in such an arrangement as to achieve shunting, thereby short-circuiting high frequency signals of various frequency components that can be amplified by the active element.

However, many problems are left unsolved with the conventional transmission lines and the communication apparatuses having the transmission lines.

For example, in the module (amplifier) shown in FIG. 23, conditions for sufficiently short-circuiting the high frequency signals of various frequency components that can be amplified by the active element 111 are not satisfied in the bias supplying passage from the main signal circuit 110 to the bias terminal Tvd. Therefore, there has been a problem that high frequency isolation characteristics between the elements and between the terminals both connected by way of the transmission line are not satisfactory. More specifically, a high capacitance chip condenser (for example, the second bypass condenser 117 shown in FIG. 23) designed for short-circuiting a low frequency band of a several tens of megahertz has a difficulty in short-circuiting a high frequency band of about a several gigahertz or more because the chip condenser has a parasitic component such as grounded capacitance. Thus, in an amplifying element structure serially connected in a general multistage wherein a rear stage active element and a front stage active element are connected to an identical bias supplying circuit, the parasitic oscillation due to the positive feedback may occur. The parasitic oscillation occurs when a high frequency signal is amplified by the rear stage active element and a component of the high frequency signal that leaks out to the bias supplying circuit of the output side and is not short-circuited is input to the front stage active element through the bias supplying circuit under the phase condition of the positive feedback.

Also, a resonance may occur due to capacitance of the first bypass condenser 114 and inductance of the transmission lines 115 and 116 of the bias supplying circuit. In this case, since a standing wave is generated to cause radiation in the transmission line 115, an unintentional connection may occur between the transmission line 115 and the peripheral circuits in a resonance frequency. Further, a transmission characteristic of the signal in the main signal circuit 110 that is connected to the short stub 113 is unintentionally improved in the resonance frequency. Consequently, a peak of unnecessary gain is generated in the resonance frequency as a characteristic of the overall amplifier.

FIG. 24 is a circuit diagram showing a circuit structure at the output side of a high frequency amplifier (module) of a second prior art in which a structure for reducing Q value of the resonance is supplemented. As shown in FIG. 24, this MMIC has a structure wherein instability is improved through attenuation of the low frequency component by disposing a resister 119 having a resistance value of R1 between the transmission line 115*a* and the transmission line 115*b* of the bias supplying circuit 120B.

However, in the structure of FIG. 24, it is necessary to set the electric resistance of the resister 119 to a large value for the purpose of eliminating the low frequency component, and, with such large electric resistance, a voltage drop of the power voltage supplied from the bias terminal Tvd is large. That is to say, a reduction in driving voltage of the MMIC may entail a drawback of deteriorating an amplifying efficiency in the MMIC and the like.

FIG. 25 is a block circuit diagram showing a circuit structure at the output side of a high frequency amplifier (module) of a third prior art in which a structure for reducing Q value of the resonance is supplemented. This high frequency amplifier is disclosed in the literature of Cheng et al.: *One Watt Q-Band Class A Pseudomorphic HEMT MMIC Amplifier,* 1994, *IEEE MTT-S Digest*, p.p. 805–808. To this circuit structure example, a method of short-circuiting a bias supplying circuit 120C by an RC serial circuit 123 in parallel with the bias supplying circuit 120C is adapted. The output circuit of the high frequency amplifier of FIG. 25 is different from that of the high frequency circuit of FIG. 23 in that the transmission line 115 to which shunt capacitances (the first bypass condenser 114 and the second bypass condenser 117) are connected at its ends in the output circuit of the high frequency amplifier of FIG. 23 is divided into transmission lines 115*a* and 115*b* and that a third bypass condenser 122 is additionally connected to a node of the transmission lines 115*a* and 115*b* to achieve the shunt arrangement. Further, a resister 121 having a resistance value of R2 is disposed between the node of the transmission lines 115*a* and 115*b* and the third bypass condenser 122. In other words, the RC serial circuit 123 functioning as a stabilizing circuit is provided between a part of the bias supplying circuit 120C and the ground conductor in the output circuit of the high frequency amplifier of FIG. 25.

A capacitance value C3 of a third bypass condenser 122 is so set as to short-circuit a high frequency signal of an intermediate frequency band that is not short-circuited by the first and the second condensers 114 and 117. The resister 121 is provided so as to reduce the unnecessary gain in the high frequency signal of a low frequency band lower than the design frequency band and to cause loss to be generated in the high frequency signal of the intermediate frequency band and short-circuit it for the purpose of improving stability of the high frequency amplifier.

However, in the high frequency amplifier shown in FIG. 25, it is necessary to provide additionally the bypass condenser 122 having a capacitance value sufficient for short-circuiting the high frequency signal of intermediate frequency and the resister 121 in the high frequency amplifier shown in FIG. 23, thereby undesirably increasing a circuit area in the whole module.

Also, it is necessary to add a via hole as a ground circuit in the high frequency amplifier using the microstrip as the transmission line, and such additional component is not preferred as it further increases the circuit area.

In the high frequency amplifier shown in FIG. 25, if the RC serial circuit 123 is disposed in the vicinity of another circuit element, electromagnetic coupling with another circuit (e.g. the main signal circuit 110) occurs to cause the drawback of making the high frequency amplifier instable. The RC serial circuit 123 could be disposed remote from the main signal circuit in order to avoid such electromagnetic coupling, but such arrangement is not preferred since it further increases the circuit area.

The above described drawbacks exist in the semiconductor integrated circuit device other than the amplifier, such as a mixer, a frequency multiplier, a switch, an attenuator, a frequency demultiplier, and an orthogonal modulator.

SUMMARY OF THE INVENTION

An object of the present invention is to provide a transmission line and a semiconductor integrated circuit device capable of improving a high frequency isolation characteristic between terminals that are connected to the transmission line.

In order to achieve the above object, the transmission line of the present invention comprises a signal strip, a resistive layer opposed to the signal strip with a dielectric layer disposed between the resistive layer and the signal strip, and a ground conductor electrically connected to the resistive layer, wherein, a high frequency current is induced in the resistive layer through capacitance formed by the dielectric layer between the signal strip and the resistive layer when a high frequency signal of a predetermined frequency is transmitted through the signal strip, and when resistance per unit length generated when the high frequency current flows in the resistive layer, and between the resistive layer and the ground conductor, is defined as an additional resistance, and resistance per unit length generated when the high frequency current flows through the ground conductor is defined as a ground resistance, the additional resistance is larger than the ground conductor. As used herein, a longitudinal direction of the unit length means a direction in which the signal is transmitted. With such constitution, the high frequency component of the signal flowing the transmission line is attenuated since a circuit in which a multiple of RC serial components are disposed in parallel is formed in the transmission line by portions of the signal strip and the resistive layer opposed to each other across the dielectric layer. Thus, when the bias supplying circuit for supplying a bias through the transmission line is connected to the circuit processing the high frequency signal, it is possible to efficiently reduce high frequency power leaking from the circuit to the bias supplying circuit. In other words, it is possible to improve the high frequency isolation characteristic between the terminals to which the transmission line is connected.

A length of the resistive layer may be 1/16 or more of an effective wavelength λ of a signal of an upper limit frequency of the high frequency signal. With such constitution, it is possible to handle capacitance and additional resistance formed between the signal strip and the resistive layer distributedly.

Conductivity of a material constituting the resistive layer may be smaller than conductivity of the ground conductor. With such constitution, it is possible to set additional resistance per unit length, which is added to the transmission line, to a value larger than resistance generated by the ground conductor per unit length in the transmission line.

The conductivity of the material constituting the resistive layer may preferably be in the range of $1\times10^3$ S/m or more and $1\times10^7$ S/m or less.

The conductivity of the material constituting the resistive layer may preferably be in the range of $1\times10^3$ S/m or more and $1\times10^5$ S/m or less.

The resistive layer may be formed from at least one material selected from the group consisting of chrome, nickel chrome alloy, iron-chrome alloy, thallium, a chrome-silicon oxide composite, titanium, an impurity doped semiconductor, and polycrystalline or amorphous semiconductors formed by polysilicon or the like. With such constitution, it is possible to set additional resistance generated in the resistive layer high.

A width of the resistive layer may be larger than a width of the signal strip.

The resistive layer may be formed in such a fashion that the whole width thereof opposed to the signal strip. With such constitution, the whole width of the signal strip opposed to the resistive layer in the width direction to suppress an electric field distribution leaking from the signal strip to the ground conductor layer, thereby enhancing the effect of improving the high frequency isolation characteristic between the terminals to which the transmission line is connected.

The signal strip may be formed on a top face of the dielectric layer; the resistive layer may be formed between the substrate and the dielectric layer; the ground conductor may be formed on a bottom face of the substrate; and the resistive layer may be connected to the ground conductor by way of a penetrating conductor penetrating the substrate. With such constitution, it is possible to obtain the transmission line suitable for a high frequency circuit having a microstrip structure.

The penetrating conductor may be formed on an edge of the resistive layer. With such constitution, it is possible to increase the additional resistance per unit length owing to the increase in passage of the high frequency current that is induced in the resistive layer.

A plurality of the penetrating conductors may be formed along a longitudinal direction of the resistive layer with a spacing. With such constitution, it is possible to dispose the capacitance and the additional resistance formed between the signal strip and the resistive layer more distributedly.

The signal strip may be formed on a top face of the dielectric layer; the resistive layer may be formed between the substrate and the dielectric layer; the ground conductor may be formed on the top face of the dielectric layer; and the resistive layer may be connected to the ground conductor by way of a penetrating conductor penetrating the dielectric layer. With such constitution, it is possible to obtain the transmission line suitable for a high frequency circuit having a coplanar waveguide structure.

The signal strip may be formed between the substrate and the dielectric layer; the resistive layer may be formed on the top face of the dielectric layer; and the ground conductor may be formed on the top face of the dielectric layer in such a fashion that the ground conductor is connected to the resistive layer. With such constitution, it is possible to omit the penetrating conductor.

A semiconductor integrated circuit device according to the present invention comprises a main signal circuit on which at least one active element is disposed and a bias supplying circuit having a transmission line and supplying bias to the main signal circuit through the transmission line, wherein at least a part of the transmission line is the transmission line according to claim 8. With such constitution, it is possible to efficiently reduce the unnecessary (frequency band of) high frequency power leaking from the main signal circuit to the bias supplying circuit, thereby enabling stable operation of the semiconductor integrated circuit device. Further, owing to this transmission line, the above-described effects are achieved without a large capacitor, thereby downsizing the semiconductor integrated circuit device.

The transmission line may have a first transmission line connected to the main signal circuit and a second transmission line connected to the first transmission line; the first transmission line may be formed by a coplanar waveguide or a microstrip; the second transmission line may be formed by at least a part of the transmission line; and an end of the first transmission line closer to the main signal circuit may be connected to a ground terminal through a bypass condenser. With such constitution, it is possible to efficiently reduce the unnecessary (frequency band of) high frequency power leaking from the main signal circuit to the bias supplying circuit with the increase in circuit area being suppressed more favorably.

The semiconductor integrated circuit device may be a single-stage high frequency amplifier having an amplifying transistor as the at least one active element; and the bypass supplying circuit may be at least one of an input side circuit that is of a front stage side with respect to the active element of the main signal circuit and an output circuit that is of a rear stage side with respective to the active element of the main signal circuit. With such constitution, it is possible to achieve the stable operation with the high frequency power of the unnecessary frequency band leaking from the main signal circuit to the bias supplying circuit being reduced.

The semiconductor integrated circuit device may be a multi-stage high frequency amplifier having a plurality of amplifying transistors as the at least one active element; and the bypass supplying circuit may be at least one of an input side circuit that is of a front stage side with respect to the active element of the main signal circuit, an output circuit that is of a rear stage side with respective to the active element of the main signal circuit, and an interstage circuit between the plurality of amplifying transistors. With such constitution, it is possible to suppress a parasitic oscillation due to a positive feedback of the high frequency power that leaks from the main signal line to the bias supplying circuit to the front stage.

Though the active element is limited to the amplifying transistor, it is needless to say that transistors that are used for the purposes other than the amplification, such as an oscillation of high frequency signal and phase control, correspond to the active element.

The above and other objects, characteristics, and advantages of the present invention will become more apparent from the following detailed description of preferred embodiments given with reference to the accompanying drawings.

DETAILED DESCRIPTION OF THE PREFERRED EMBODIMENTS

Embodiments of the present invention will hereinafter be described with reference to the drawings.

(First Embodiment)

Figure 1:
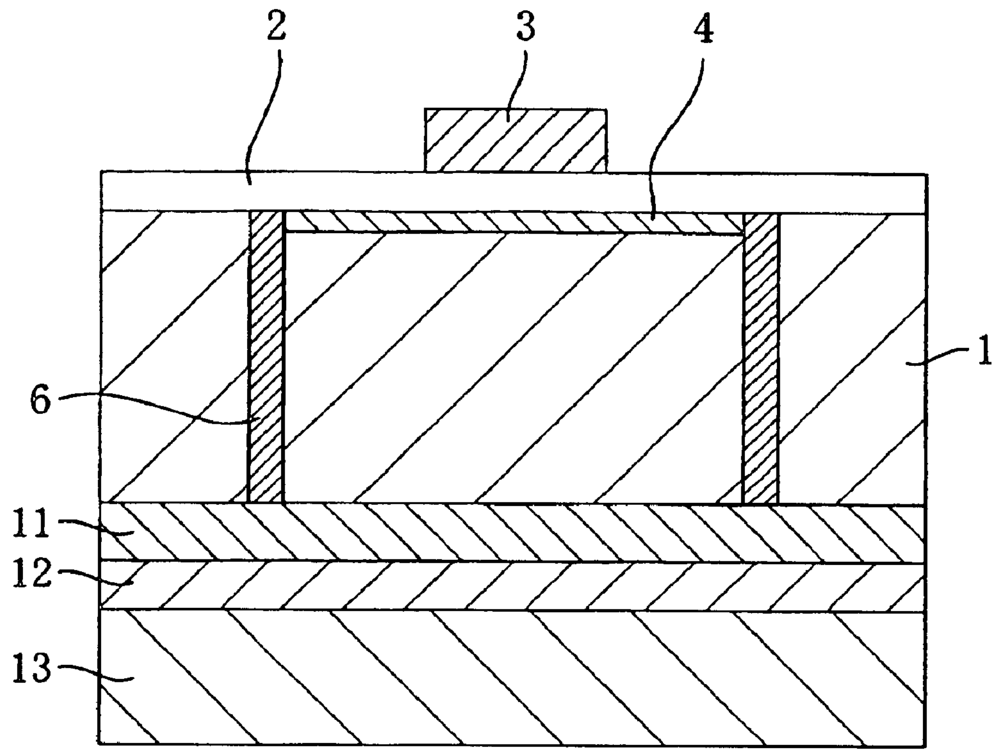
FIG. 1 is a sectional view showing a structure of a transmission line according to a first embodiment of the present invention.
Figure 2:
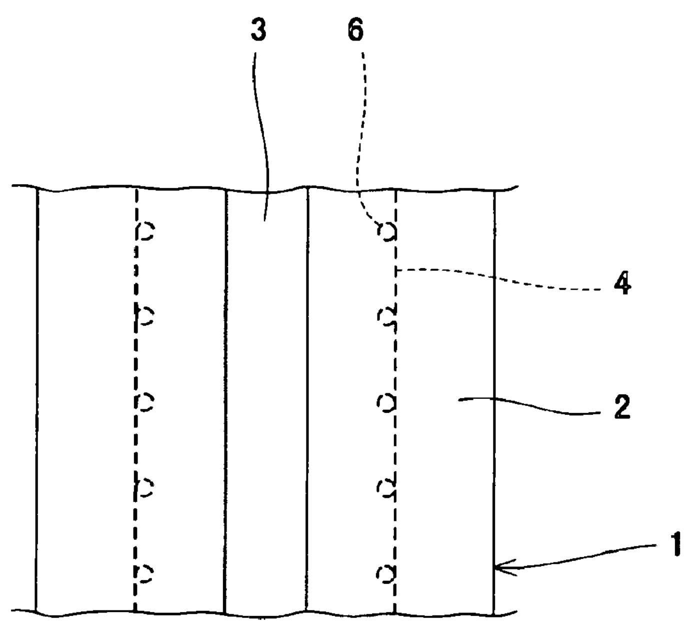
FIG. 2 is a top view showing a structure of the transmission line of FIG. 1 as viewed from above.

FIG. 1 is a sectional view showing a structure of a transmission line according to the first embodiment of the present invention, and FIG. 2 is a top view showing a structure of the transmission line of FIG. 1 as viewed from above.

As shown in FIG. 1, the transmission line of this embodiment is provided with a dielectric substrate 1, a dielectric film 2 disposed on a top face of the dielectric substrate 1, a signal strip 3 disposed on a top face of the dielectric film 2, a resistive layer 4 formed between the dielectric substrate 1 and the dielectric film 2 as opposed to the signal strip 3 with the dielectric film 2 disposed between the resistive layer 4 and the signal strip 3, a ground conductor layer 11 disposed on a bottom face of the dielectric film 2, penetrating conductors 6 penetrating the dielectric layer 2 to connect the resistive layer 4 to the ground conductor layer 11.

As shown in FIG. 2, the signal strip 3 and the resistive layer 4 are formed in the shape of a strip and in such a fashion that the signal strip 3 is positioned within a width of the resistive layer 4 in the top view. The penetrating conductors 6 each have the shape of a cylinder and aligned along an edge of the resistive layer 4 in the longitudinal direction of the resistive layer 4 with a predetermined pitch.

The signal strip 3 is connected to an external circuit. The ground conductor layer 11 is connected to a whole face of an external high frequency ground 13 with a solder 12 being sandwiched therebetween, so that a high frequency grounding function of the ground conductor layer 11 is reinforced.

Next, the resistive layer 4 and the penetrating conductors 6 that characterize the present invention will be described.

In the present invention, a value of capacity (hereinafter, this value is represented as a value per unit length of the transmission line and referred to as "Cadd") formed between the resistive layer 4 and the signal strip 3 and electric resistance (additional resistance: hereinafter, this resistance is represented as a value per unit length of the transmission line and referred to as "Radd") occurring when a current induced in the resistive layer 4 flows into the ground conductor layer 11 through the penetrating conductors 6 may preferably be arranged distributedly. More specifically, a length of the resistive layer 4 may preferably be set to such a value that makes it possible to consider Cadd and Radd are arranged distributedly with respect to a transmitted signal. That is to say, a lower limit of the length of the resistive layer 4 may preferably be $\lambda/16$ or more when an effective wavelength of an upper limit frequency signal of high frequency signals transmitted through the transmission line is $\lambda$ in view of a dielectric constant of the dielectric film 2. Note that an upper limit is equivalent to a length of the transmission line. The length of the transmission line substantially is a length of the signal strip 3 in this embodiment. As used herein, the high frequency is a generic name of electromagnetic waves of frequencies in the range of 1 MHz or more and 1 THz or less because the high frequency is a frequency that the amplifier can amplify, though the specific value is varied depending on the transistor to be used.

The number of the penetrating electrodes 6 may be one, and, in the case of using a plurality of the penetrating electrodes, the pitch may preferably be small as possible. This is because the smaller pitch enables Cadd and Radd to be arranged more distributedly.

Radd must be larger than resistance (ground resistance) of the ground conductor layer 11. It is possible to realize the larger Radd by properly setting conductivities and shapes of the ground conductor layer 11 and the penetrating conductors 6.

In the case of obtaining the larger Radd by properly setting the conductivities, conductivity of a resistor constituting the resistive layer 4 is set to a value lower than the conductivity of the ground conductor layer 11. Specifically, the conductivity of the resistor constituting the resistive layer 4 may preferably be in the range of $1\times10^3$ S/m or more and $1\times10^7$ S/m or less, more preferably in the range of $1\times10^3$ S/m or more and $1\times10^5$ S/m or less.

More specifically, it is preferable that the ground conductor layer 11 is formed from a high conductivity material such as gold and the resistive layer 4 is constituted by a low conductive resistor, i.e., a resistor formed from a low conductivity material such as chrome, nickel-chrome alloy, iron-chrome alloy, thallium, chrome-silicon oxide composite, titanium, impurity semiconductor, a polycrystalline semiconductor film made from polysilicon or the like and an amorphous semiconductor film.

Optionally, the conductivities of the penetrating conductors 6 may be set similar to the conductivity of the resistive layer 4.

In the case of obtaining the larger Radd by properly setting the shapes, a thickness of the resistive layer 4 may be reduced, for example. Also, the penetrating conductors 6 may be disposed as close as possible to the edge of the resistive layer 4.

Optionally, a sectional area of each of the penetrating conductors 6 may be reduced. Yet optionally, a length of each of the penetrating conductors may be increased.

EXAMPLE 1

The transmission line having the structure shown in FIG. 1 was fabricated as Example 1 according to the first embodiment of the present invention under the following conditions. The dielectric substrate 1 was formed by a gallium arsenide (GaAs) substrate having a thickness of 500 $\mu$m and a dielectric constant of 13; the dielectric film 2 was formed by a silicon nitride (SiN) film having a thickness of 1 $\mu$m and a dielectric constant of 7; and the signal strip 3 and the ground conductor layer 5 were formed by gold having conductivity of $3\times10^7$ S/m and a thickness of 5 $\mu$m. An impurity diffusion layer having a thickness of 0.2 $\mu$m and conductivity of $4\times10^4$ S/m was formed directly under a surface of the dielectric substrate 1 formed from gallium arsenide, and the impurity diffusion layer was used as the resistive layer 4. A width of the signal strip 3 was 20 $\mu$m, and a width of the resistive layer 4 was 100 $\mu$m. The signal strip 3 and the resistive layer 4 were disposed in such a fashion that centerlines thereof were conformed to each other. The penetrating conductors 6 penetrating the dielectric substrate 1 and having a diameter of 5 $\mu$m were formed from gold and used for connecting the ground conductor layer 11 to the resistive layer 4 as being aligned with a pitch of 100 $\mu$m thereby to short-circuit the resistive layer 4.

Figure 3:
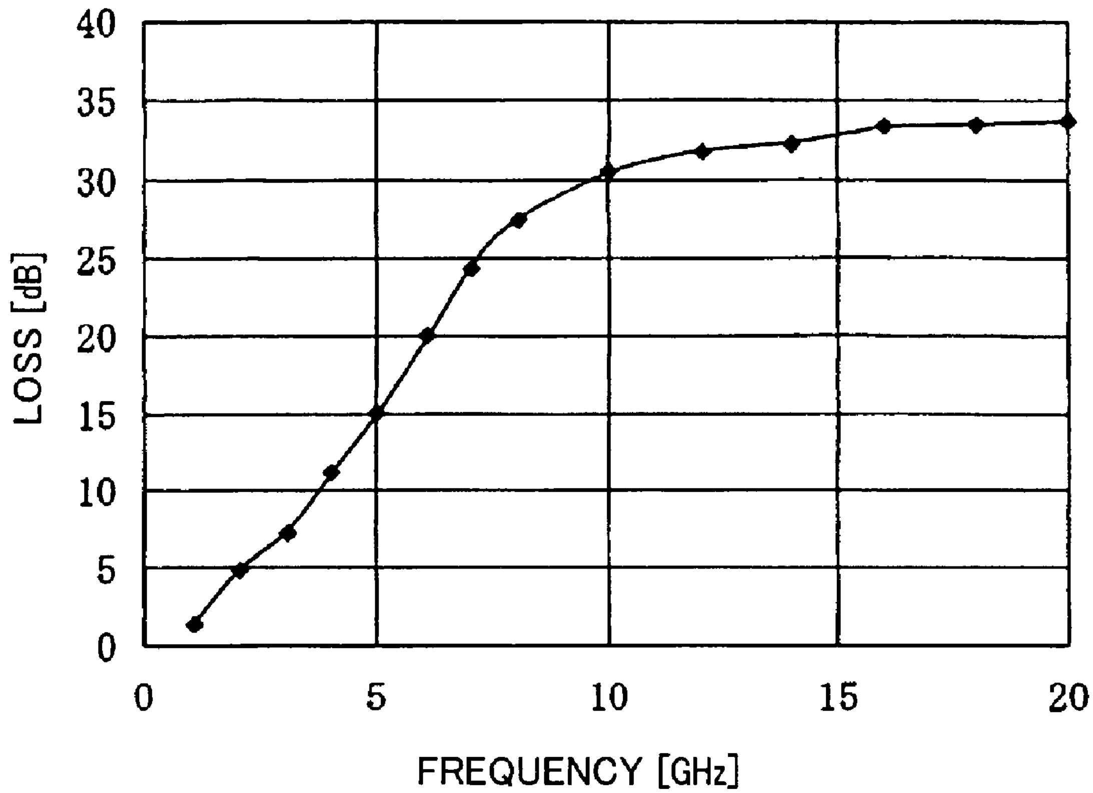
FIG. 3 is a graph showing a frequency dependence of a transmission loss of the transmission line of Example 1 according to the first embodiment of the present invention.

FIG. 3 is a graph showing a frequency dependence of a transmission loss of the transmission line of Example 1. The vertical axis of FIG. 3 indicates an effective loss occurring in the transmission line when a high frequency signal passes therethrough, the effective loss being a value obtained by multiplying a maximum available power gain by −1.

As shown in FIG. 3, transmission losses per 5 mm of the transmission line of this Example at 1 GHz, 5 GHz, and 10 GHz are 1.4 dB, 15.0 dB, and 30.6 dB, respectively. On the other hand, the loss does not change substantially in the typical microstrip in the frequency band from 1 to 10 GHz. Thus, it was confirmed that the transmission line of this Example selectively attenuates the high frequency signals in particular.

Consequently, it is possible to attenuate high frequency power without attenuating DC power by the use of the transmission line of this embodiment. That is, since it is possible to attenuate the high frequency power leaking from the main signal circuit in which the active element is disposed to the peripheral circuits by disposing the transmission line of this embodiment in the bias circuit, it is possible to realize a structure of a semiconductor integrated circuit that has a bias supplying circuit excellent in high frequency isolation characteristic and is excellent in high frequency characteristic.

[Principle of the Present Invention]

Figure 4A:
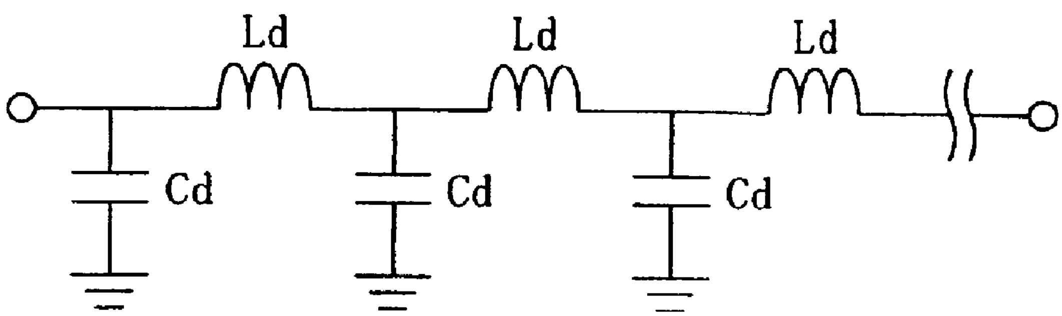
FIG. 4A is an equivalent circuit diagram of a conventional transmission line.
Figure 4B:
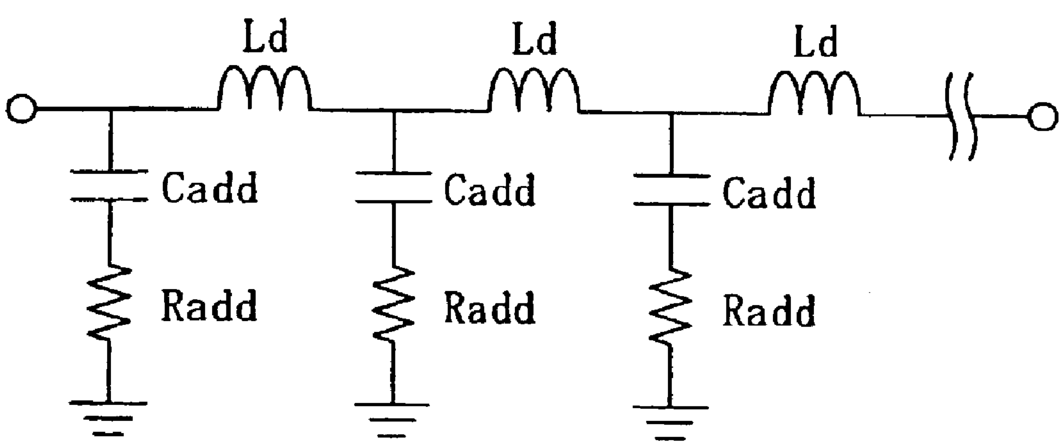
FIG. 4B is an equivalent circuit diagram of the transmission line of the present invention.

Hereinafter, the principle of attenuating the high frequency signal in the transmission line of the present invention will be described. FIG. 4A is an equivalent circuit diagram of a conventional transmission line, and FIG. 4B is an equivalent circuit diagram of the transmission line of the present invention.

Figure 22A:
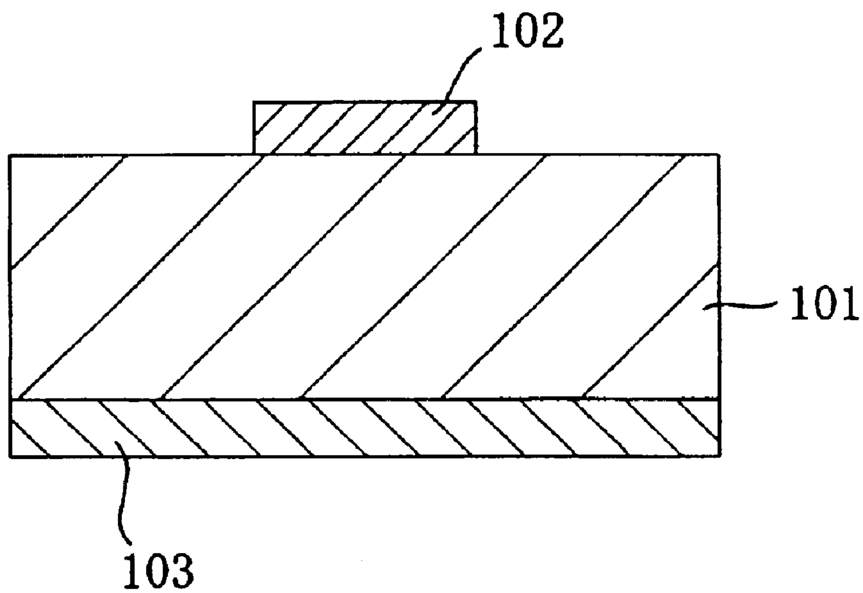
FIG. 22A is a sectional view schematically showing a structure of a conventional microstrip.
Figure 22B:
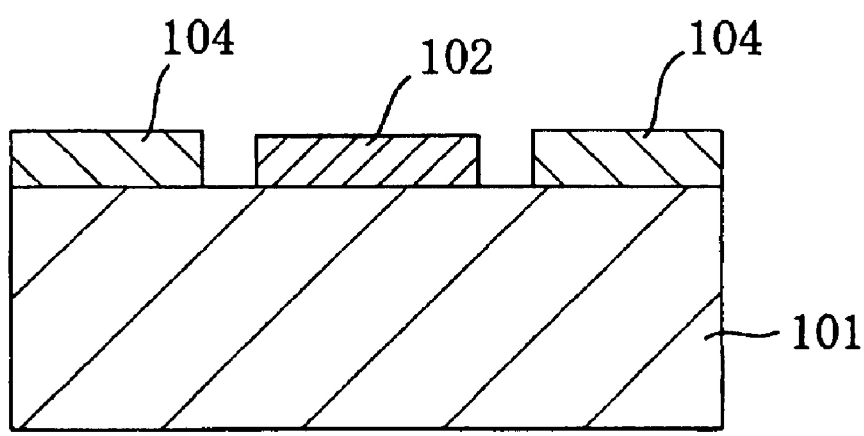
FIG. 22B is a sectional view schematically showing a structure of a conventional coplanar waveguide.
Figure 23:
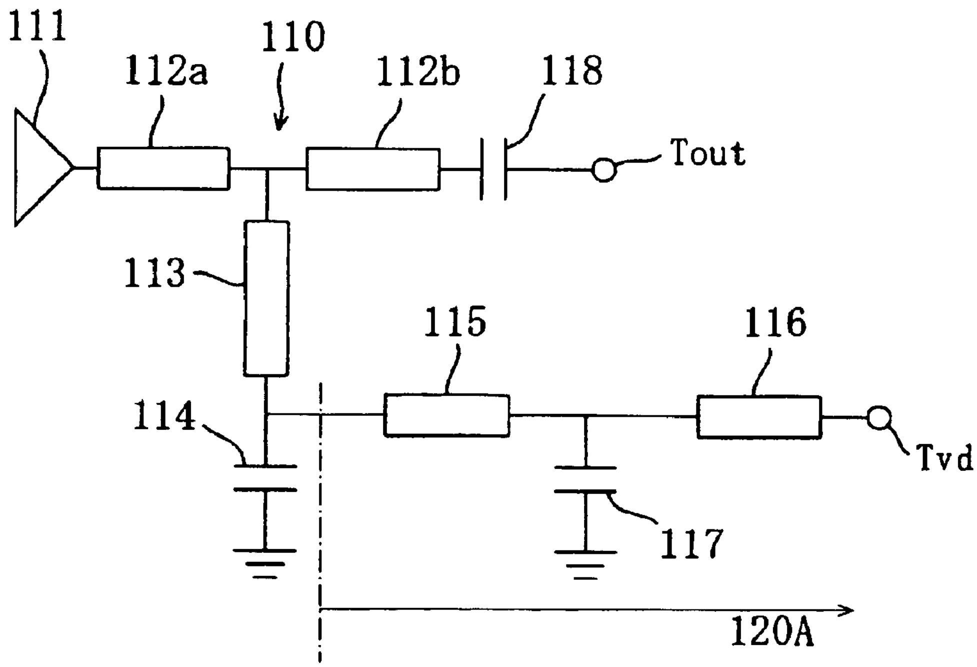
FIG. 23 is a circuit diagram showing a circuit structure of the output side of a module functioning as a high frequency amplifier of a first prior art.

As shown in FIG. 4A, the equivalent circuit in the high frequency region of the conventional transmission line is the circuit in which capacitances Cd per unit length between a signal strip (the signal strip 102 shown in FIG. 22) and a ground conductor layer (the ground conductor layer 103 shown in FIG. 22) and inductances Ld each indicating a signal phase change per unit length in signal transmission exist distributedly.

In turn, as shown in FIG. 1, in the transmission line of the present invention, the resistive layer 4 formed by the resistor having low conductivity exists between the signal strip 3 and the ground conductor layer 11. Along the longitudinal direction of the transmission line shown in FIG. 2, capacitance of Cadd per unit length occurs between the opposing portions of the resistive layer 4 and the signal strip 3; inductance Ld per unit length occurs in the signal strip 3; and resistance Radd per unit length occurs in the resistive layer 4. Since the resistance Radd exists between the ground conductor (the ground conductor layer 11) and each of the capacitances Cadd along the longitudinal direction of the transmission line, the signal attenuating function is improved. In this case, the opposing portions are continuous and not clearly defined. However, in the case where the penetrating conductors 6 are disposed with the predetermined pitch as shown in FIG. 1, it is regarded that the Ld, Cadd, and Radd of the equivalent circuit shown in FIG. 4B exist for the respective penetrating conductors 6.

Here, the capacitances Cadd between the signal strip 3 and the resistive layer 4 function as capacitances for shunting. In view of that each of the capacitances functions as a high-pass filter that blocks a signal having a frequency lower than a specific frequency (called "cut-off frequency") depending on the capacitance of the high-pass filter and passing a signal of a high frequency band higher than the cut-off frequency, it should be understood that a higher value of the capacitance Cadd is effective for maintaining the power attenuating effect, which is the effect of the present invention, even in the low frequency band.

In order to increase the value of capacitance Cadd, it is effective to increase the dielectric constant of the material used for forming the dielectric film 2, to reduce the thickness of the dielectric film 2, and to increase the width of each of the signal strip 3 and the resistive layer 4.

The resistance Radd depends on sheet resistance of the resistive layer 4, i.e., the conductivity of the material used for forming the resistive layer 4, and the thickness of the resistive layer 4. Also, the resistance Radd depends largely on the distance from the region between the signal strip 3 and the resistive layer 4 that functions as a capacitor to the region of connection to the ground conductor layer 11. Further, the resistance value Radd depends on the resistance of the penetrating conductors 6, too. Moreover, the resistance value Radd depends on the length of the penetrating conductors 6, too.

(Second Embodiment)

Figure 5:
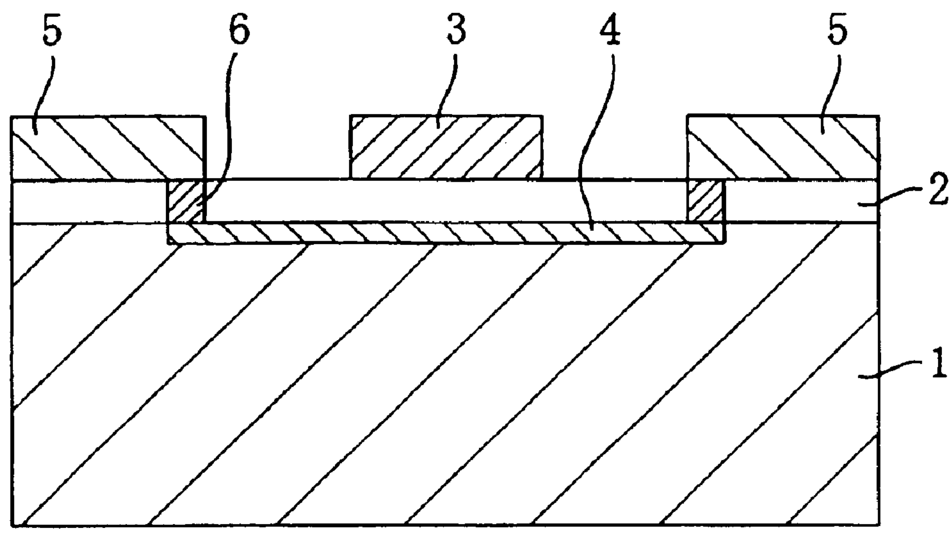
FIG. 5 is a sectional view schematically showing a structure of a transmission line according to a second embodiment of the present invention.
Figure 6:
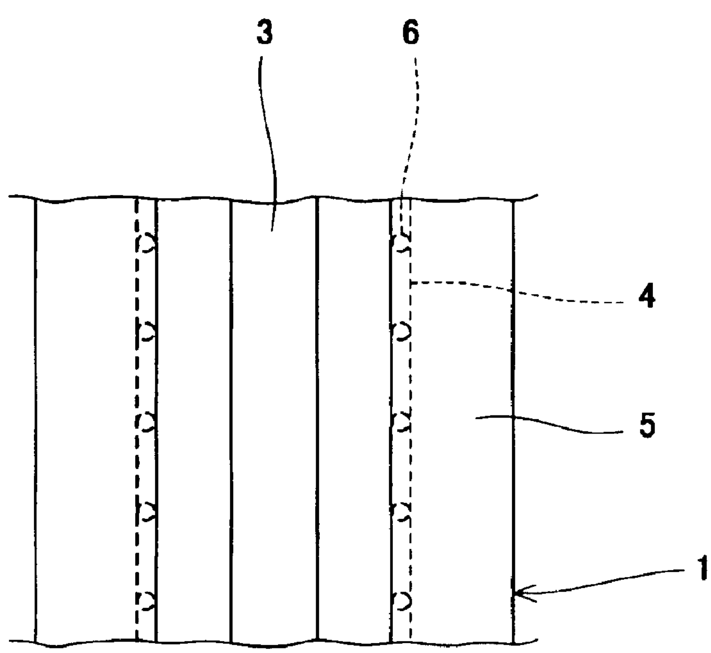
FIG. 6 is a top view showing the transmission line of FIG. 5 as viewed from above.

FIG. 5 is a sectional view schematically showing a structure of a transmission line according to the second embodiment of the present invention, and FIG. 6 is a top view showing a structure of the transmission line of FIG. 5 as viewed from above.

As shown in FIG. 5, the transmission line of this embodiment has a dielectric substrate 1, a dielectric film 2 disposed on a top face of the dielectric substrate 1, a signal strip 3 disposed on a top face of the dielectric film 2, a resistive layer 4 disposed between the dielectric substrate 1 and the dielectric film 2 as opposed to the signal strip 3 with the dielectric film 2 disposed between the resistive layer 4 and the signal strip 3, a pair of ground conductor layers 5 disposed on the top face of the dielectric film 2 as each opposed to the signal strip 3 with a predetermined spacing in the width direction of the signal strip 3, and penetrating conductors 6 penetrating the dielectric film 2 and connecting the resistive layer 4 and the ground conductor layers 5 to each other.

As shown in FIG. 6, the signal strip 3 and the resistive layer 4 are formed in the shape of a strip, and, in the top view, the signal strip 3 is positioned within a width of the resistive layer 4. The penetrating conductors 6 are formed on the edge of the resistive layer 4 along the longitudinal direction of the resistive layer 4 with a predetermined pitch. The ground conductor layers 5 are formed in parallel with the signal strip 3.

Constitution other than the above is the same as those of the first embodiment.

EXAMPLE 2

The transmission line having the structure shown in FIG. 5 was fabricated as Example 2 according to the second embodiment. In this Example, thicknesses and materials of the signal strip 3, the dielectric film 2, the dielectric substrate 1, and the ground conductor layers 5 were the same as those of Example 1 of the first embodiment, and a diameter and a material of the penetrating conductors 6 are the same as those of Example 1 of the first embodiment. The ground conductor layer 5 having a length of 5 mm and a width of 20 mm was formed along each side of the signal strip 3. A distance between the signal strip 3 and each of the ground conductor layers 5 was 30 mm. The ground conductor layers 5 and an external high frequency ground (not shown) were electrically connected by way of a multiple of wire bonding with a pitch of 200 $\mu$m, thereby to reinforce the high frequency grounding function of the ground conductor layers 5.

Figure 7:
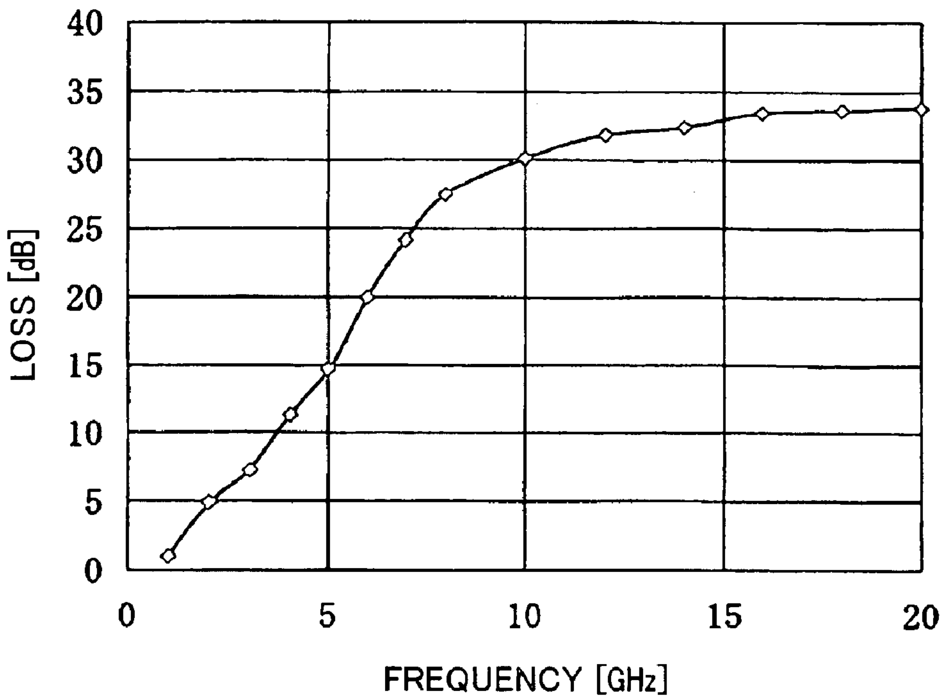
FIG. 7 is a graph showing a frequency dependence characteristic of a transmission loss of the transmission line of Example 2 according to the second embodiment of the present invention.

FIG. 7 is a graph showing a frequency dependence characteristic of a transmission loss of the transmission line of Example 2. The vertical axis of FIG. 7 indicates an effective loss occurring in the transmission line when a high frequency signal passes therethrough, the effective loss being a value obtained by multiplying a maximum available power gain by −1.

As shown in FIG. 7, the transmission losses of the transmission line of Example 2 at 1 GHz, 5 GHz, and 10 GHz were 1.1 dB, 14.2 dB, and 30.4 dB, respectively.

COMPARATIVE EXAMPLE 1

A transmission line of Comparative Example 1 was fabricated to be compared with Example 2 in terms of the transmission loss. In the transmission line of Comparative Example 1, the resistive layer 4 and the penetrating conductors 6 are omitted. In short, the transmission line of Comparative Example 1 has the structure of the ordinary coplanar wave guide shown in FIG. 22, wherein materials and dimensions of other components are the same as those of Example 2. The losses per 5 mm of the transmission line of Comparative Example 1 at 1 GHz, 5 GHz, and 10 GHz were 0.1 dB, 0.2 dB, and 0.3 dB, respectively.

From the results of the comparison between the Comparative Example 1 and Example 2, it was confirmed that Example 2 attenuates the high frequency signal. It is needless to say that direct current resistances of the transmission lines of Example 2 and Comparative Example 1 were not varied from each other.

Thus, it was proved that Example 2 is capable of obtaining a high frequency attenuating characteristic that is substantially the same as that of Example 1 of the first embodiment and the effect of the present invention is maintained irrelevant from the change in the method of connecting the resistive layer 4 and the ground conductor layers 5.

Hereinafter, Examples that achieve advantageous effects of the transmission line of this embodiment by effectively changing the capacitance Cadd and the resistance Radd based on the principle of the present invention explained in the first embodiment will be described.

EXAMPLE 3

As Example 3 according to the second embodiment, a transmission line with the signal strip 3 and the resistive layer 4, wherein a width of the signal strip 3 was changed to 50 μm and a width of the resistive layer 4 was changed to 100 μm, was fabricated. The distance between the signal strip 3 and the resistive layer 4 was set to 15 μm. Other conditions were the same as those of Example 2.

Figure 8:
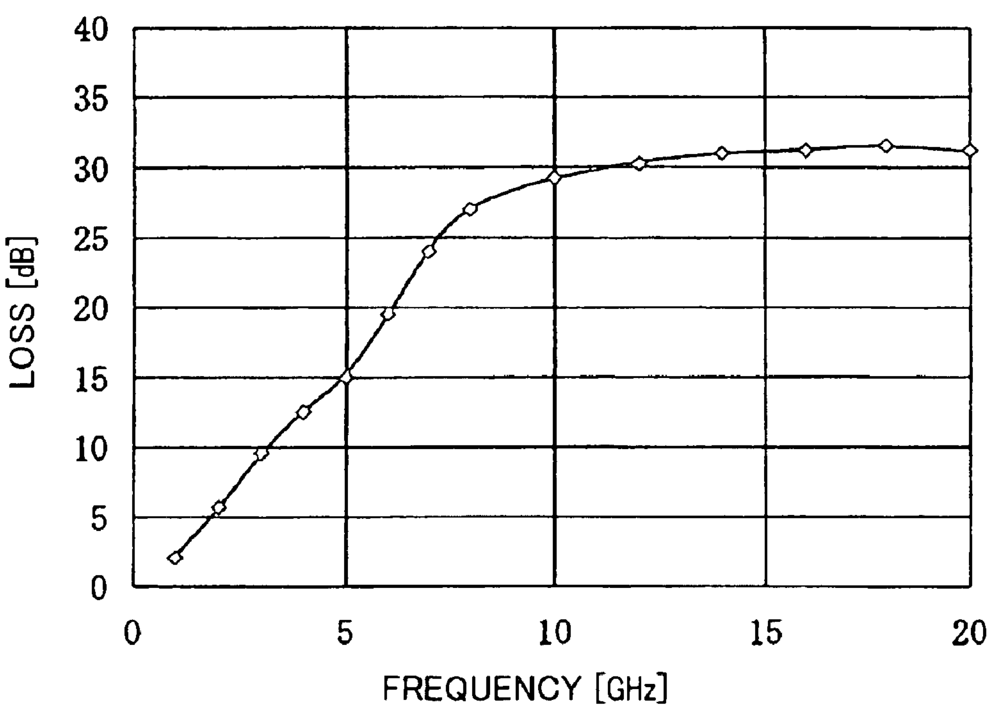
FIG. 8 is a graph showing a frequency dependence of a transmission loss of Example 3 according to the second embodiment of the present invention.

FIG. 8 is a graph showing a frequency dependence of a transmission loss of the transmission line of Example 3. The vertical axis of FIG. 8 indicates an effective loss occurring in the transmission line when a high frequency signal passes therethrough, the effective loss being a value obtained by multiplying a maximum available power gain by −1.

As shown in FIG. 8, the transmission losses per 5 mm of the transmission line of Example 3 at 1 GHz, 5 GHz, and 10 GHz were 2.1 dB, 15.2 dB, and 29.2 dB, respectively. Here, the transmission loss at 1 GHz was increased because capacitance generated between the signal strip 3 and the resistive layer 4 was increased due to the increase in the width of the signal strip 3, whereby the effect of the present invention is exerted also on the low frequency signal. In turn, the transmission loss at 10 GHz was slightly reduced as compared with Example 1 because an area of an opposing region of the signal strip 3 and the resistive layer 4 was increased with the increase in width of the signal strip 3, thereby a width of a region other than that opposed to the signal strip 3 of the resistive layer 4 was increased, whereby reducing the resistance applied to the high frequency signal before the high frequency signal was short-circuited.

EXAMPLE 4

As Example 4 according to the second embodiment, a transmission line was fabricated in such a manner that a thickness of the region of the dielectric film 2 at which the signal strip 3 and the resistive layer 4 is opposed to each other was reduced from 1 μm to 0.2 μm. Further, a thickness of the signal strip 3 used in Example 2 was increased to 50 μm and a width of the resistive layer 4 used in Example 2 was increased to 100 μm. A distance between the signal strip 3 and each of the ground conductor layers 5 was set to 15 μm. Other conditions were the same as those of Example 2.

Figure 9:
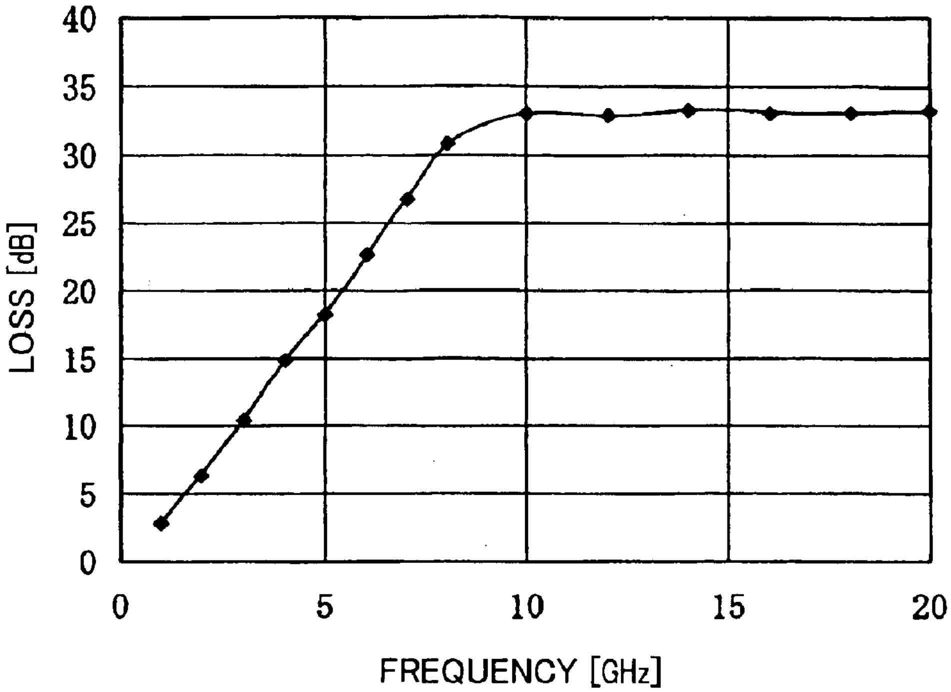
FIG. 9 is a graph showing a frequency dependence of a transmission loss of Example 4 according to the second embodiment of the present invention.

FIG. 9 is a graph showing a frequency dependence of a transmission loss of the transmission line of Example 4. The vertical axis of FIG. 9 indicates an effective loss occurring in the transmission line when a high frequency signal passes therethrough, the effective loss being a value obtained by multiplying a maximum available power gain by −1.

As shown in FIG. 9, transmission losses per 5 mm of the transmission line of Example 4 at 1 GHz, 5 GHz, and 10 GHz were 2.8 dB, 18.2 dB, and 33.2 dB, respectively. Here, the transmission loss at 1 GHz was increased because capacitance generated between the signal strip 3 and the resistive layer 4 was increased due to the reduction in the distance between the signal strip 3 and the resistive layer 4 whereby enhancing the effect of the present invention.

EXAMPLE 5

As Example 5 according to the second embodiment, a transmission line was fabricated in the same manner as in Example 2 except for replacing the silicon nitride film of the dielectric layer 2 with a strontium titanate film. Other conditions were the same as those of Example 2.

Figure 10:
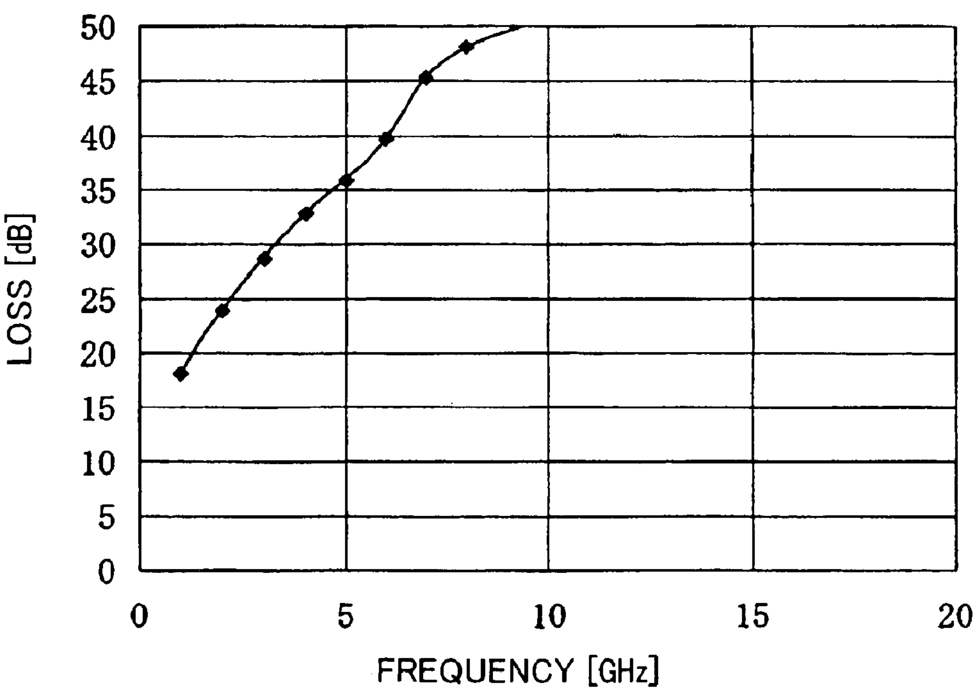
FIG. 10 is a graph showing a frequency dependence of a transmission loss of Example 5 according to the second embodiment of the present invention.

FIG. 10 is a graph showing a frequency dependence of a transmission loss of the transmission line of Example 4. The vertical axis of FIG. 10 indicates an effective loss occurring in the transmission line when a high frequency signal passes therethrough, the effective loss being a value obtained by multiplying a maximum available power gain by −1.

As shown in FIG. 10, the transmission losses per 5 mm of the transmission line of Example 5 at 1 GHz, 5 GHz, and 10 GHz were 18.2 dB, 36.1 dB, and 50 dB or more. Here, the transmission loss at 1 GHz was increased in the transmission line of this Example because a dielectric constant of this Example was increased to 150 as compared with the dielectric constant of 7 of Example 2 whereby increasing capacitance generated between the signal strip 3 and the resistive layer 4.

As is apparent from foregoing Examples 3 to 5, it was proved that the effect of the present invention of increasing the transmission loss of the high frequency signal in the transmission line is enhanced with the increase in the capacitance Cadd.

(Third Embodiment)

Figure 11:
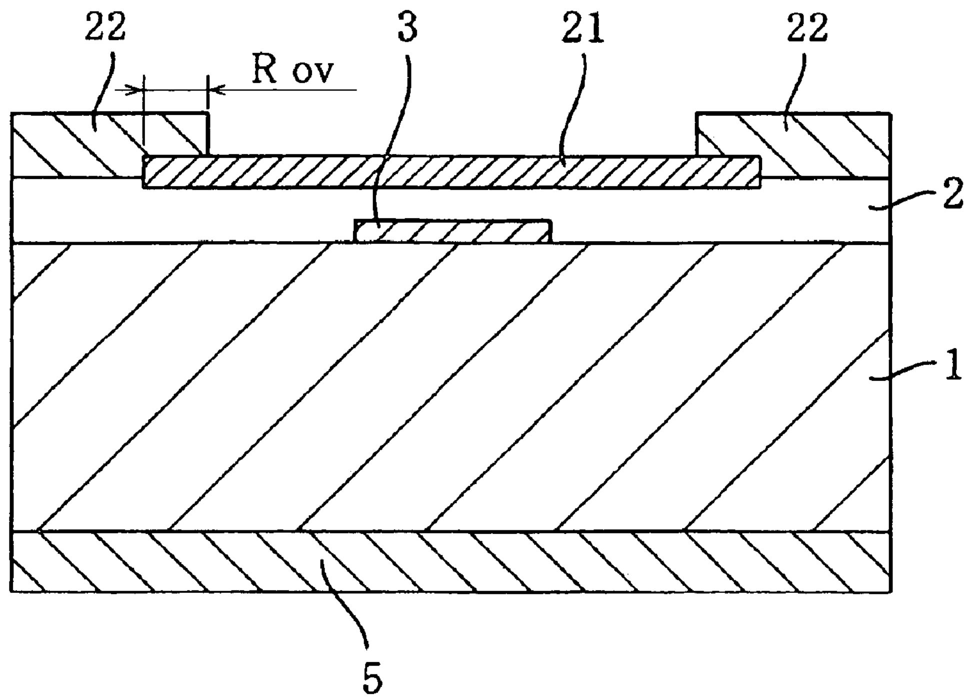
FIG. 11 is a sectional view schematically showing a structure of a transmission line according to a third embodiment of the present invention.

FIG. 11 is a sectional view schematically showing a structure of a transmission line according to the third embodiment of the present invention.

As shown in FIG. 11, the transmission line of this embodiment has a dielectric substrate 1, a signal strip 3 disposed on a top face of the dielectric substrate 1, a dielectric film 2 covering the top face of the dielectric substrate 1 and the signal strip 3, a resistive layer 21 disposed on a top face of the dielectric film 2 as disposed to the signal strip 3 with the dielectric film 2 disposed between the resistive layer 4 and the signal strip 3, a first ground conductor layer 22 disposed on the top face of the dielectric film 2 so as to be connected to the resistive layer 21, and a second ground conductor layer 23 disposed on a bottom face of the dielectric substrate 1. That is, the transmission line of this embodiment can be considered to have a structure obtainable by reversing the structure of the second embodiment wherein the signal strip 3 is disposed on the top face of the dielectric film 2 and the resistive layer 4 is disposed on the bottom face of the dielectric film 2 and by disposing the signal strip 3 and the resistive layer 21 on the bottom face and the top face of the dielectric film 2, respectively.

In this embodiment, by forming the ground conductor layer 22 after forming the resistive layer 21, a region Rov where the ground conductor layer 22 and the resistive layer 21 are overlapped is formed on the top face of the dielectric film 2. In this embodiment, a width of the overlapping region Rov is set to 10 μm, for example. Electric connection between the resistive layer 21 and the ground conductor layer 22 is established in the overlapping region Rov. Therefore, in this embodiment, the penetrating conductor for high frequency grounding is not required.

Further, the first ground conductor layer 22 and the second ground conductor layer 23 are connected to each other by a through hole (not shown) or the like. The second ground conductor layer 23 is not included in the essential elements in the constitution of the present invention. However, in the high frequency amplifier using the transmission line of this embodiment, a ground conductor layer is typically disposed on the bottom face of the dielectric substrate 1 and, therefore, the transmission line of this embodiment is adapted readily to the high frequency amplifier by being provided with the second ground conductor layer 23 such as in this embodiment.

Constitution other than those described above is the same as those of the first embodiment.

EXAMPLE 6

As Example 6 according to the third embodiment, a transmission line having the structure shown in FIG. 11 was fabricated. In this Example, materials of the dielectric substrate 1 and the dielectric film 2 were the same as those of Example 1 of the first embodiment. The signal strip 3 was formed by a gold film having a thickness of 0.2 $\mu$m and conductivity of $2\times10^7$ S/m, and the resistive layer 21 was formed by a nickel chrome alloy film having a thickness of 20 nm and conductivity of $1.5\times10^5$ S/m. The nickel chrome alloy film was prepared, for example, by subjecting an alloy consisting of 70% of nickel and 30% of chrome to an electron beam evaporation thereby to form a film with a growing speed of 1,000 angstrom per minute. Widths of the signal strip 3 and the resistive layer 21 were the same as those of Example 1 of the first embodiment. A material of the ground conductor 22 and a position of the ground conductor 22 on the top face of the dielectric film 2 were the same as those of Example 2 of the second embodiment. Note that, since it is necessary to connect an external circuit to the signal strip 3 in order to measure a high frequency characteristic, a penetrating conductor penetrating the dialectic film 2 to be connected to the signal strip 3 was formed so that the measurement was conducted by fetching the signal on the signal strip 3 from the bottom face of the dielectric layer 2 to the top face of the dielectric layer 2.

Figure 12:
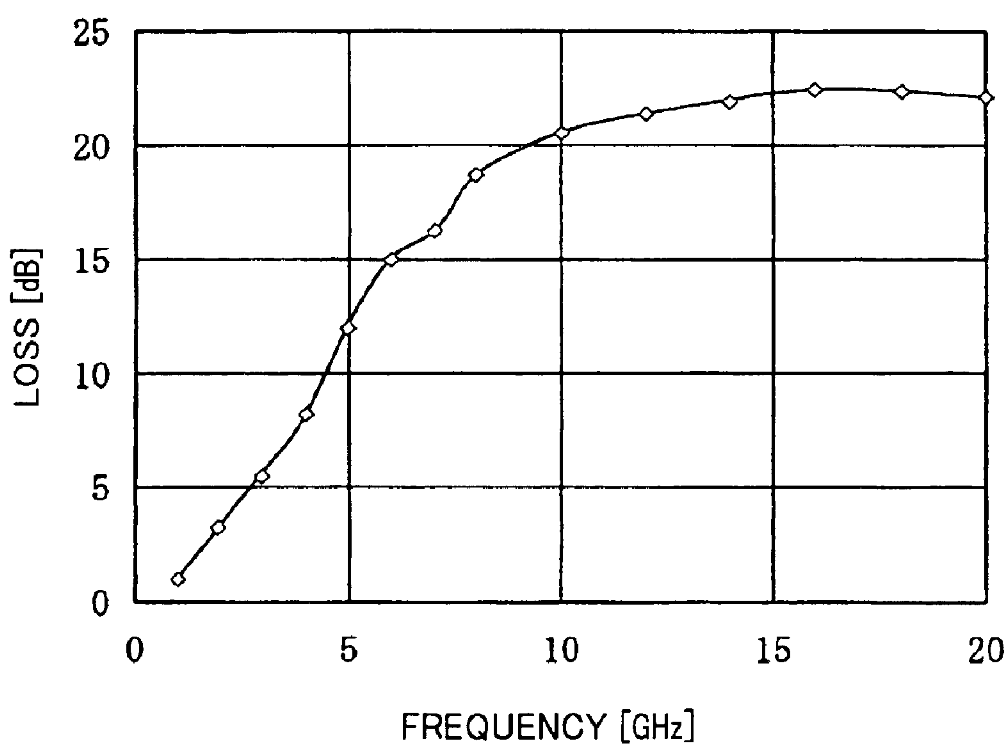
FIG. 12 is a graph showing a frequency dependence of a transmission loss of Example 6 according to the third embodiment of the present invention.

FIG. 12 is a graph showing a transmission loss of the transmission line of Example 6 according to the third embodiment. The vertical axis of FIG. 12 indicates an effective loss occurring in the transmission line when a high frequency signal passes therethrough, the effective loss being a value obtained by multiplying a maximum available power gain by −1.

As shown in FIG. 12, the transmission losses per 5 mm of the transmission line of Example 5 at 1 GHz, 5 GHz, and 10 GHz were 1.0 dB, 12.0 dB, and 20.6 dB, respectively. In this Example, a high frequency attenuating characteristic substantially the same as that of Example 1 of the first embodiment was obtained, and it was proved that the effect of the present invention is not lost by the change in the method of connecting the resistive layer to the ground conductor and the changes in relationship among the signal strip, the resistive layer, and the dielectric film.

Note that the effect of the present invention was not lost also in the transmission lines of Example 1 of the first embodiment and Example 5 of the third embodiment where the arbitrary number of dielectric layers were additionally disposed on the top face of the dielectric film or the bottom face of the dielectric substrate.

Further, it was confirmed that the isolation characteristic between the bias terminals of the amplifiers was improved by adapting the transmission line according to the first to the third embodiments to the bias supplying circuit for the amplifier (semiconductor integrated circuit device) used in a communication apparatus.

Also, a reduction in parasitic oscillation and more stable operation of the amplifier were confirmed.

(Fourth Embodiment)

Figure 13:
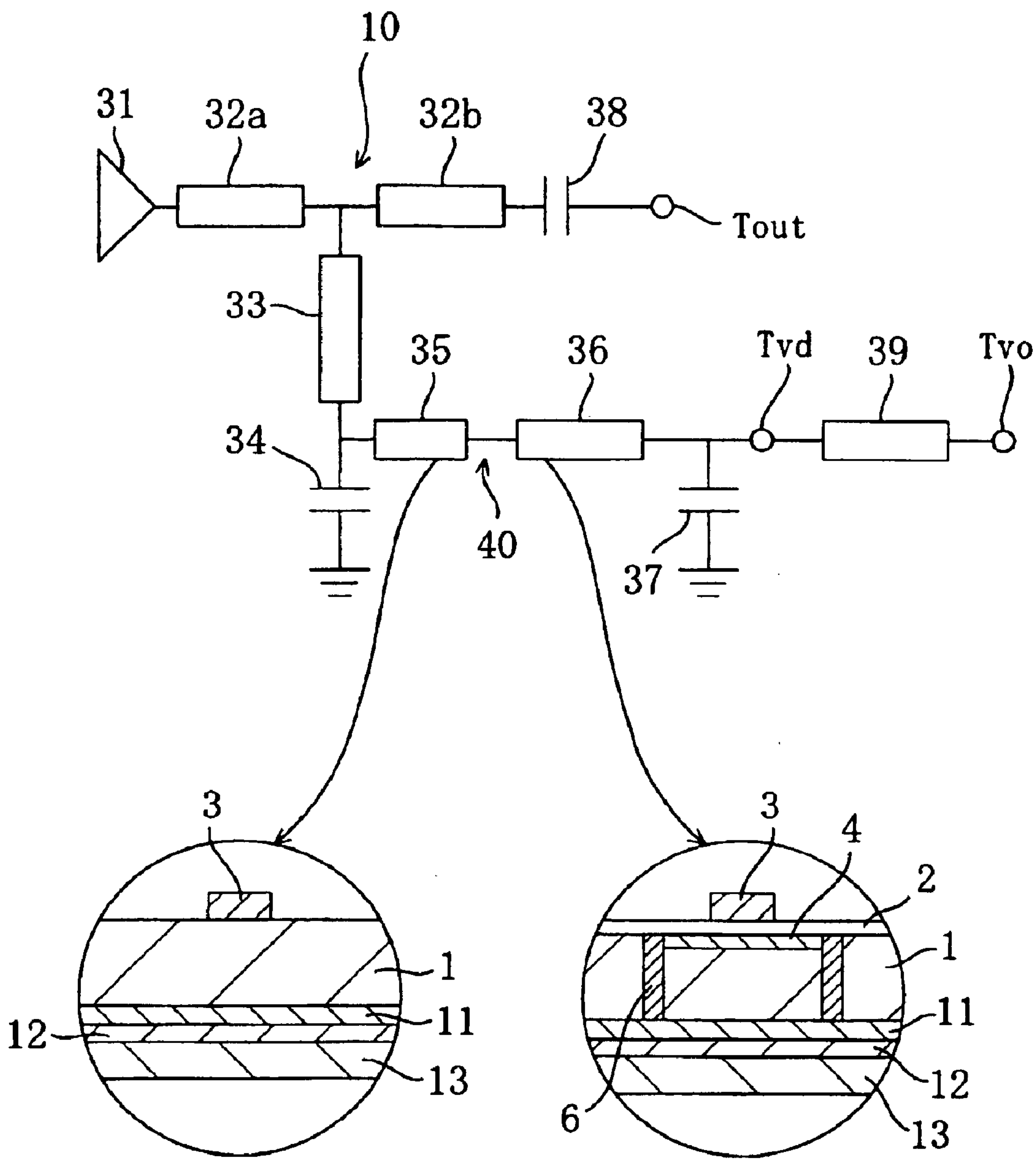
FIG. 13 is a circuit diagram showing structures of an output circuit and a bias circuit in a semiconductor integrated circuit functioning as a high frequency amplifier.

FIG. 13 is a circuit diagram showing structures of an output circuit and a bias circuit in a semiconductor integrated circuit (MMIC) functioning as a high frequency amplifier according to the fourth embodiment of the present invention. In FIG. 13, the reference numerals of FIG. 1 are used for indicating the common components.

In FIG. 13, the MMIC has an active element 31, an output terminal Tout, main signal lines 32*a* and 32*b* for electrically connecting the active element 31 to the output terminal Tout, a DC blocking capacitor 38 disposed between the main signal line 32*b* and the output terminal Tout, a short stub 33 branching from an intermediate portion of the main signal lines 32*a* and 32*b*, a first bypass condenser 34 disposed between the short stub 33 and the ground, a bias terminal Tvd for supplying a DC power voltage, a first and a second transmission lines 35 and 36, and a second bypass condenser 37 disposed between a portion between the second transmission line 36 and the bias terminal Tvd and the ground for short-circuiting a signal of a low frequency region. An external bias supplying circuit 39 for controlling the bias to be supplied to the bias terminal Tvd and an external bias terminal Tvo are provided outside the MMIC. Here, a main signal circuit 10 is constituted of the active element 32, the main signal lines 32*a* and 32*b*, the DC blocking capacitor 38, and so forth. The short stub 33 branched from the main signal circuit 10 serves as a RF matching circuit and bias supplying circuit. A bias supplying circuit 40 is constituted of the short stub 33, the first and the second transmission lines 35 and 36, and the first and the second bypass condensers 34 and 37. Though not shown in FIG. 13, the main signal lines 32*a* and 32*b* and the like are connected to the output terminal Tout through matching circuits such as an arbitrary number of branching short stubs and DC blocking capacitors. The first bypass condenser 34 shown in FIG. 13 is an MIM capacitor. The MIM capacitor is inserted between the short stub 33 and the ground and capacitance thereof is set to such a value that enables RF short-circuiting with respect to the design frequency band, thereby functioning as the first bypass condenser 34.

The first transmission line 35 of the bias supplying circuit 40 has the structure of an ordinary microstrip, and the second transmission line 36 has the structure of the transmission line of the present invention shown in FIGS. 1, 5 or 11. An equivalent circuit of the second transmission line 36 is represented by the distributed circuit shown in FIG. 4B.

For example, as shown in a lower part of FIG. 13, the second transmission line 36 has the structure of the transmission line shown in FIG. 1 of the first embodiment. The first transmission line 35 is constituted of the dielectric substrate 1 (e.g. GaAs substrate), the signal strip 3 and the ground conductor layer 11 that are used also by the second transmission line, for example, and the first and the second transmission lines 35 and 36 are connected to a whole surface of an external high frequency ground 13 by a solder 12. In the first transmission line 35, a dielectric film may be disposed between the dielectric substrate 1 and the signal strip 3.

The second transmission line 36 may have the structure shown in FIG. 5 or 9. When the second transmission line 36 has the structure shown in FIG. 5, the first transmission line 35 may preferably have the structure of the coplanar waveguide. When the second transmission line 36 has the structure shown in FIG. 9, the signal strip 3 is formed directly on the dielectric substrate 1 and then the dielectric film 2, the resistive layer 21, and the ground conductor 22 are formed thereon.

According to the semiconductor integrated circuit of this embodiment, owing to the second transmission line 36 having a high frequency attenuating function, the condenser that has heretofore been required for preventing the parasitic oscillation is no longer necessary, thereby downsizing the MMIC.

The second bypass condenser 37 may be disposed in the external bias supplying circuit 39 that is provided outside the amplifier, not in the amplifier.

Further, electric connection between the inside and the outside of the amplifier in the bias terminal Tvd may be achieved by employing wire bonding, bumping or like connection methods.

In the case of a multistage amplifier, the bias terminal Tvd may be shared in some cases inside the amplifier for sharing the bias supplying circuit among active elements of the stages driven by an identical potential.

Figure 25:
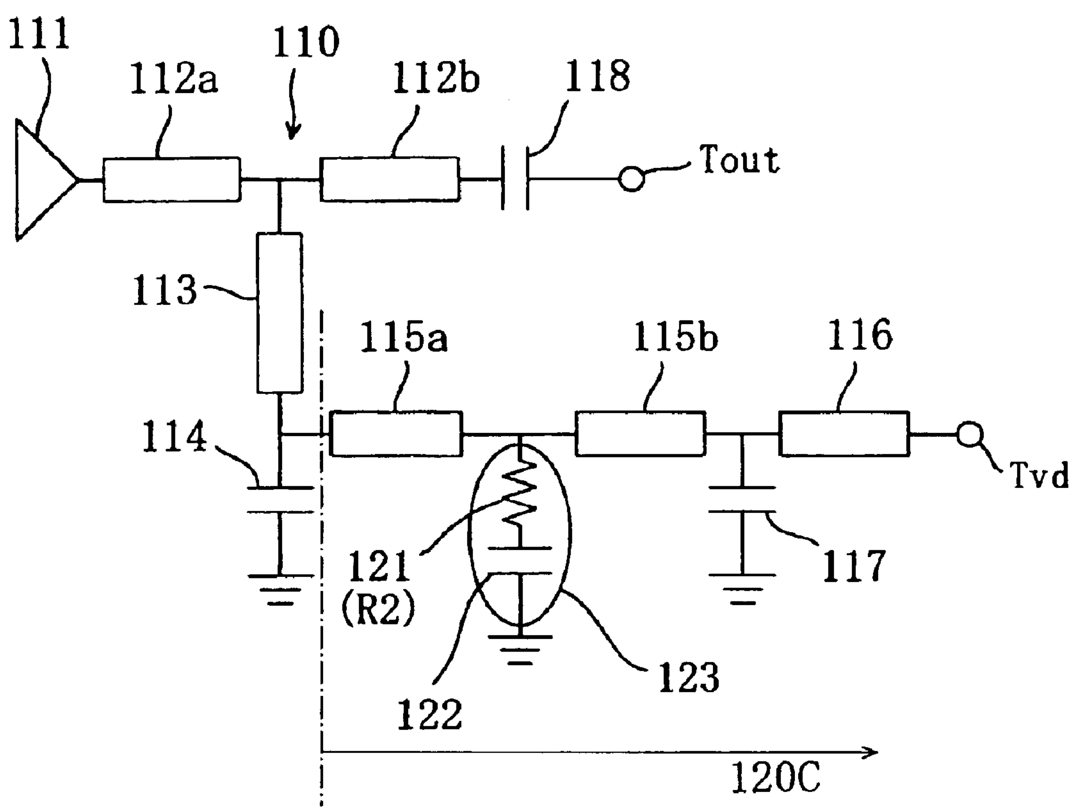
FIG. 25 is a block circuit diagram showing a circuit structure of the output side of a high frequency amplifier of a third prior art in which another structure for reducing Q value of resonance is supplemented.

In the prior arts, a circuit structure wherein the first bypass condenser 114 and the RC serial circuit 123 are arranged in parallel as shown in FIG. 25 is widely utilized for the purposes of reducing the unnecessary gain in the frequency lower than the design frequency band and improving the stability. In the RC serial circuit 123, it is possible to obtain an equivalent circuit of the transmission line of the present invention shown in FIG. 4B if the resistance 121 and the third bypass condenser 122 are caused to function as a distributed circuit and the order of arrangement of the resistance and the condenser is reversed. Thus, it is apparent that the conventional circuit and the equivalent circuit can achieve the same effect as a circuit.

Consequently, it should be understood that, owing to the amplifier of the present invention, since the signal of low frequency band that cannot be terminated by the first bypass condenser 34 is attenuated in the second transmission line 36 of the bias supplying circuit 40, an improvement in stability, a reduction in unnecessary gain, and a reduction in intensity of a signal leaking to the external circuits of the amplifier can be achieved.

Figure 14:
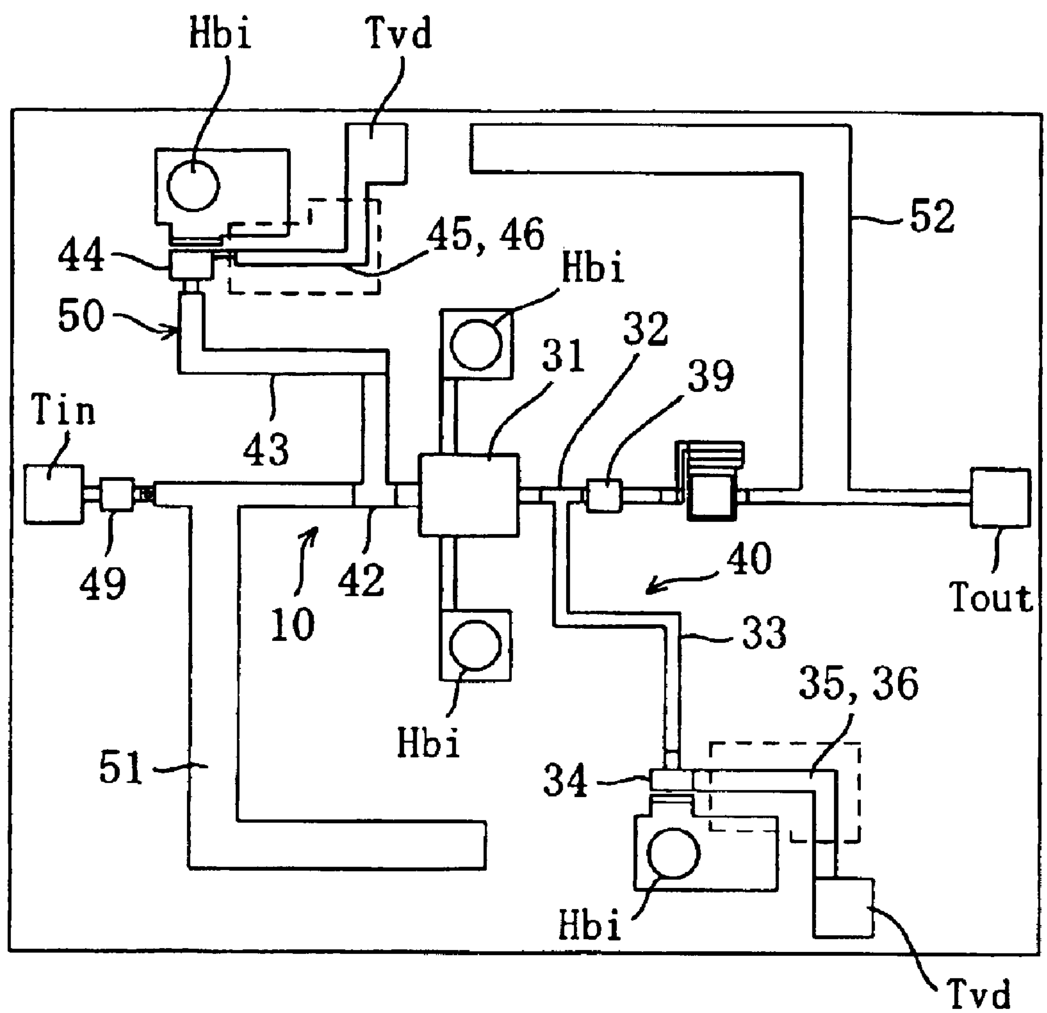
FIG. 14 is a block diagram schematically showing an example of a single-stage amplifier that is a GaAs-based MMIC according to the present embodiment.

FIG. 14 is a block diagram schematically showing an example of an overall single-stage amplifier as viewed from above, the amplifier being a GaAs-based MMIC according to this embodiment.

As shown in FIG. 14, this MMIC is provided with a circuit corresponding to that shown in FIG. 13 having the active element (amplifying MESFET) 31, the output terminal Tout, the main signal line 32, the DC blocking capacitor 38, the short stub 33, the first bypass condenser 34, the bias terminal Tvd, and the first and the second transmission lines 35 and 36 as well as an input circuit. The input circuit is provided with an input terminal Tin, a DC blocking capacitor 49, a main signal line 42, and an input side bias supplying circuit 50 branching from a midway of the main signal line 42. The input side bias supplying circuit 50 is provided with a short stub 43, an input side bypass condenser 44, a first and a second transmission lines 45 and 46, and a bias terminal Tvd. The second transmission line 46 has a structure the same as that of the second transmission line shown in FIG. 13. Indicated by Hbi is a via hole for short-circuiting the short stubs 33 and 43 in high frequency, and each of reference numerals 51 and 52 denotes an open stub.

Figure 15:
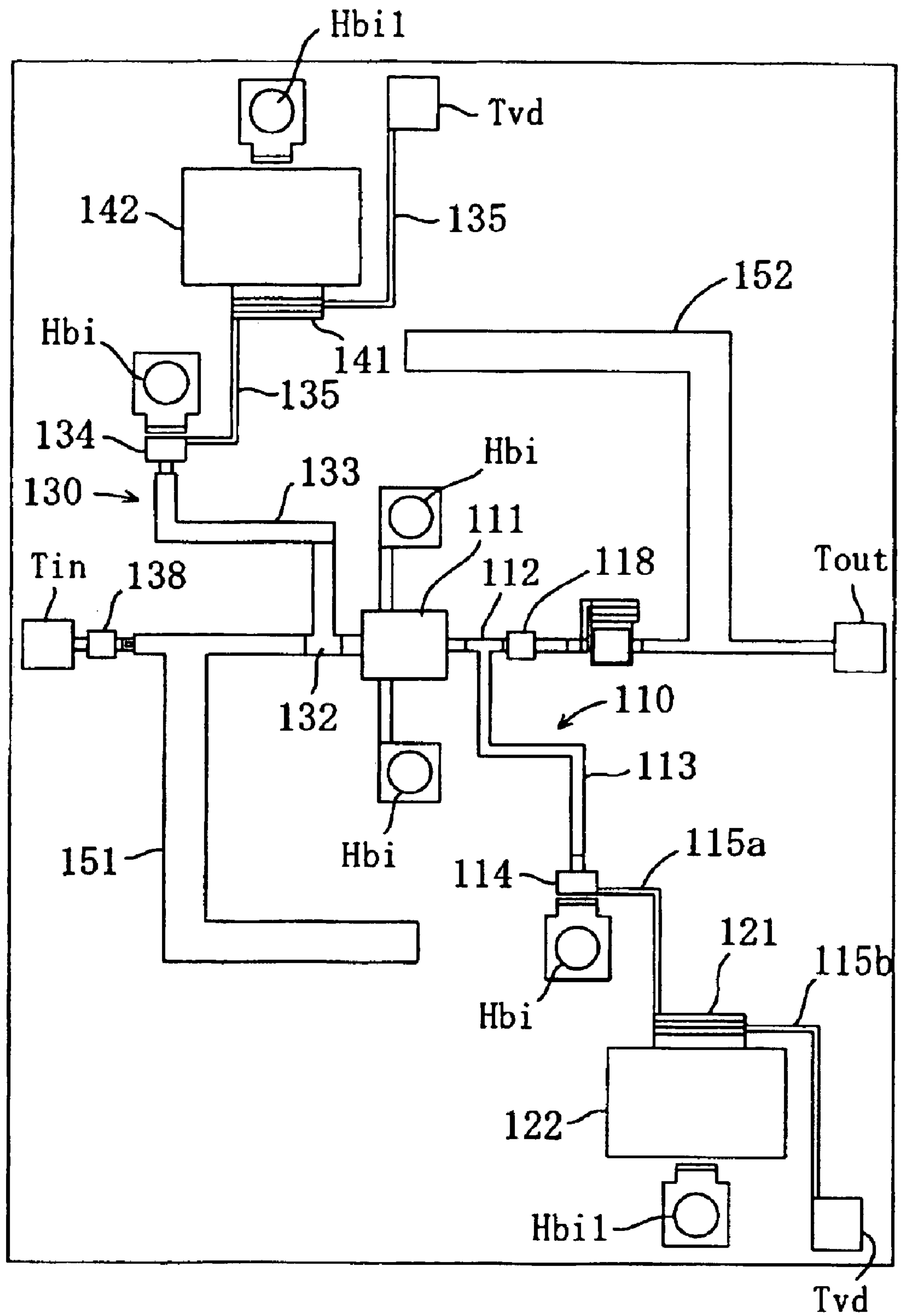
FIG. 15 is a block diagram schematically showing an example of a structure of the overall conventional MMIC shown in FIG. 25 as viewed from above.

FIG. 15 is a block diagram schematically showing an example of the overall conventional MMIC of FIG. 25 as viewed from above.

As shown in FIG. 15, this MMIC is provided with a circuit corresponding to that shown in FIG. 25 having the active element (amplifying MESFET) 111, the output terminal Tout, the main signal line 112, the DC blocking capacitor 118, the short stub 113, the first bypass condenser 14, the bias terminal Tvd, the transmission lines 115*a* and 115*b*, the resistor 121 of the RC serial circuit (stabilizing circuit) 123, and the third bypass condenser 122 as well as an input circuit. The input circuit is provided with an input terminal Tin, a DC blocking capacitor 138, a main signal line 132, and an input side bias supplying circuit 130 branching from a midway of the main signal line 132. The input side bias supplying circuit 130 is provided with a short stub 133, an input side bypass condenser 134, a transmission line 135, a resistor 141 of the stabilizing circuit, a third bypass condenser 142, and a bias terminal Tvd. Indicated by Hbi is a via hole for short-circuiting the short stubs 113 and 133 in high frequency, and each of reference numerals 151 and 152 denotes an open stub.

As is apparent from the comparison between FIG. 15 and FIG. 14, by the use of the transmission lines (the second transmission lines 36 and 56) of the present invention in the bias supplying circuit 40, it is possible to realize a reduction in space for the overall MMIC (integrated circuit device), i.e., downsizing of the overall MMIC, with the parasitic oscillation and the leak of high frequency power being suppressed.

Though the second bypass condenser 37 shown in FIG. 13 is not incorporated in the MMIC in the structure example of FIG. 14, the second bypass condenser 37 may be incorporated in the MMIC.

In a multistage amplifier, the transmission line of the present invention (see FIGS. 5, 1, and 9) can be used in any of an input circuit, an interstage circuit, and an output circuit.

The semiconductor integrated circuit of the present invention is not limited to the high frequency amplifier described in this embodiment and can be adapted to devices using the high frequency signal such as a mixer (blender), a frequency multiplier, a switch, an attenuator, a frequency demultiplier, and an orthogonal modulator.

In addition, a field effect transistor, a heterojunction bipolar transistor, and the like can be used as the active element.

EXAMPLE 7

A single-stage amplifier having the structure of MMIC shown in FIG. 13 was fabricated as Example 7 of the fourth embodiment under the following conditions.

A T-shaped gate AlGaAs/InGaAs heterojunction FET (gate width Wg=100 μm) having a gate length of 0.2 μm was used as the active element 31. The dielectric layer 2 was formed byom a silicon nitride film having a thickness of 1 μm, and the dielectric substrate 1 was formed by a gallium arsenide substrate having a thickness of 100 μm. The signal strip 3 was formed by depositing a gold film having a thickness of 3 μm. As the resistive layer 4, an impurity diffusion layer having a thickness of 0.2 μm was formed on a surface of the top face of the gallium arsenide substrate. Used as the transmission line was a microstrip using the signal strip 3 as its signal line. An AuSn film having a thickness of 10 μm was formed on a bottom face of the gallium arsenide substrate to be used as the ground conductor layer 11.

The amplifier of this Example was designed to achieve a design frequency of from 25 to 27 GHz. A short stub matching circuit was used as the drain side circuit (output circuit) of the amplifier, and the stub 33 was short-circuited in such a manner that a tip thereof is connected to a via hole through the bypass condenser of 0.5 pF. The via hole penetrates the gallium arsenide substrate 1 to be connected to the ground conductor layer 11 on the bottom face. A portion of an upper electrode of the bypass condenser 34 branches with a width of 20 μm to be connected to the signal strip of the transmission line of the bias supplying circuit 40. Since the capacitance value of 0.5 pF of the bypass condenser 34 is sufficient for RF-short-circuiting a signal of the design frequency band, relative to the amplifier, the bias supplying circuit 40 appears to be open in the design band. A length of the signal strip 3 and the resistive layer 4 was set to 300 μm, and widths of the signal strip and the resistive layer were respectively set to 30 μm and 80 μm. One via hole was formed as a penetrating conductor 6 on one side of the resistive layer 4 to be connected to the ground conductor layer 11 and to short-circuit the resistive layer 4. The identical via hole was used as the via hole connected to the resistive layer 4 and the via hole short-circuiting the short stub 33. The bias supplying circuit 40 is terminated with a square bias terminal Tvd having a side length of 80 μm and connected by wire bonding to the external bias supplying circuit 39 formed on a multilayer ceramic substrate and provided outside the amplifier. In the external bias supplying circuit 39 provided outside the amplifier, the low frequency band was short-circuited by a chip condenser of 100 pF. The amplifier obtained a small signal gain of 9.2 dB at 25 to 27 GHz. A stability factor K exceeded 1 in all frequency band to thereby confirm stable operation. Further, the stability factor K did not change with changes in the electric length of a wiring from the power unit to the bias terminal Tvd, a characteristic impedance, a length of the wire used for bonding, and the number of the wires in the external bias supplying circuit 39 provided outside.

COMPARATIVE EXAMPLE 2

As Comparative Example 2, a high frequency amplifier having a structure the same as that of Example 7 except for omitting the resistive layer 4 was fabricated.

Figure 16:
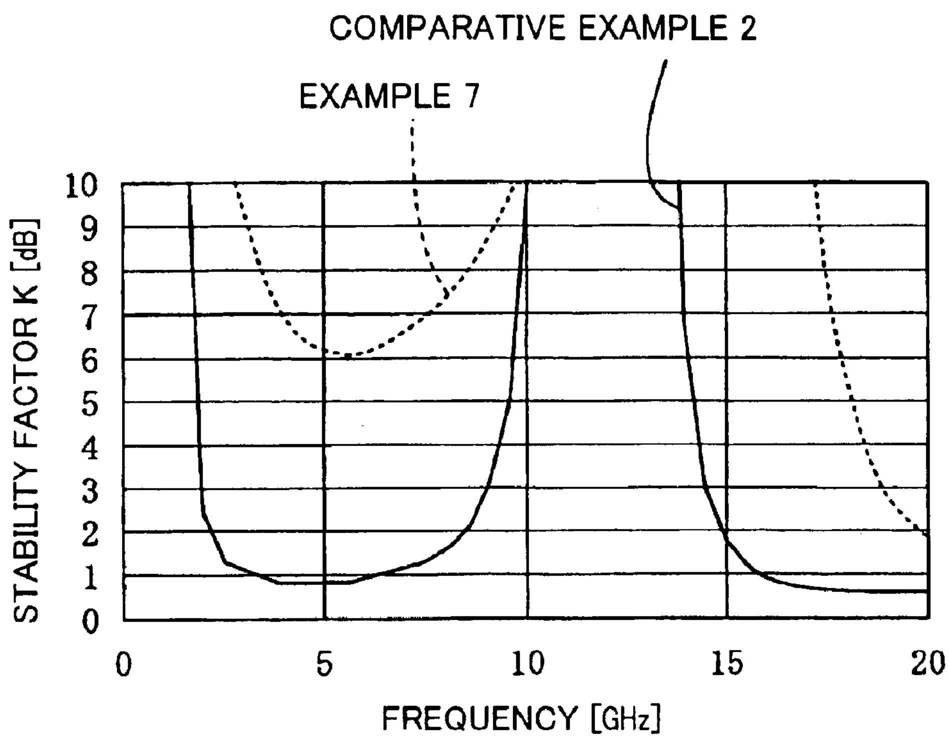
FIG. 16 is a graph showing a comparison between a high frequency amplifier of Example 7 according to a fourth embodiment of the present invention and a high frequency amplifier of Comparative Example 2 in terms of a frequency dependence of a stability factor K.

FIG. 16 is a graph showing a comparison between the high frequency amplifier of Example 7 and the high frequency amplifier of Comparative Example 2 in terms of a frequency dependence of stability factor K. Referring to FIG. 16, a dashed line indicates a characteristic of the high frequency amplifier of Example 7, while a solid line indicates a characteristic of the high frequency amplifier of Comparative Example 2. As shown in FIG. 16, in the amplifier of Example 7 having the structure of the present invention, the stability factor K is 1 or more with respect to the frequency of from 0 to 20 GHz thus achieving a stable characteristic. On the other hand, in the amplifier of Comparative Example 2, the stability factors K at 16 GHz and 20 GHz are respectively 0.91 and 0.61, which are lower than 1, and it is difficult to secure stable operation.

Further, the amplifier of Comparative Example 2 was examined for presence of oscillation operation under the condition where the length of the wiring from the wire to the power unit and a characteristic impedance of the wiring line on the external bias supplying circuit formed on the multilayer ceramic substrate are set to 2 mm and 75 Ω, respectively. Then, when the length of the wiring was changed to 5 mm in the 80 amplifiers that did not oscillate, 32 amplifiers out of the 80 amplifiers oscillated. Also, when the characteristic impedance of the wiring was changed to 40 Ω, 9 amplifiers out of the 80 amplifiers oscillated.

Further, in the amplifier of Comparative Example 2, with respect to the 80 amplifiers that did not oscillate when the length of the bonding wire used for connecting the bias terminals was set to 0.5 mm and each of the terminals was connected by using a wire having a diameter of 50 μm, the bonding wire length was changed to 1 mm. As a result, 40 amplifiers oscillated. When the number of the wire was changed to 2 in the 80 amplifiers that did not oscillate, 12 amplifiers oscillated.

In the comparison between the amplifiers in terms of the stability factors K in the low frequency band of from 3 to 6.5 GHz, the amplifier of Example 7 achieved the stability factor of 6 or more and operated stably, while the amplifier of Comparative Example 2 was unstable and the stability factor K thereof was less than 1. Further, in the amplifier of Comparative Example 2, due to a variation in characteristic of the active element, 20% of 100 amplifiers oscillated at a frequency band near 5 GHz.

As can be seen from the above comparison, since it is possible to attenuate the high frequency signal leaking from the short stub circuit 33 to the bias supplying circuit 40 in the MMIC of this embodiment, the influence that the impedance change of the external bias supplying circuit 39 connected to the external of the bias supplying circuit 40 exerts on the characteristic of the amplifier is reduced, so that an advantageous effect of stable operation of the amplifier is attained.

Figure 17:
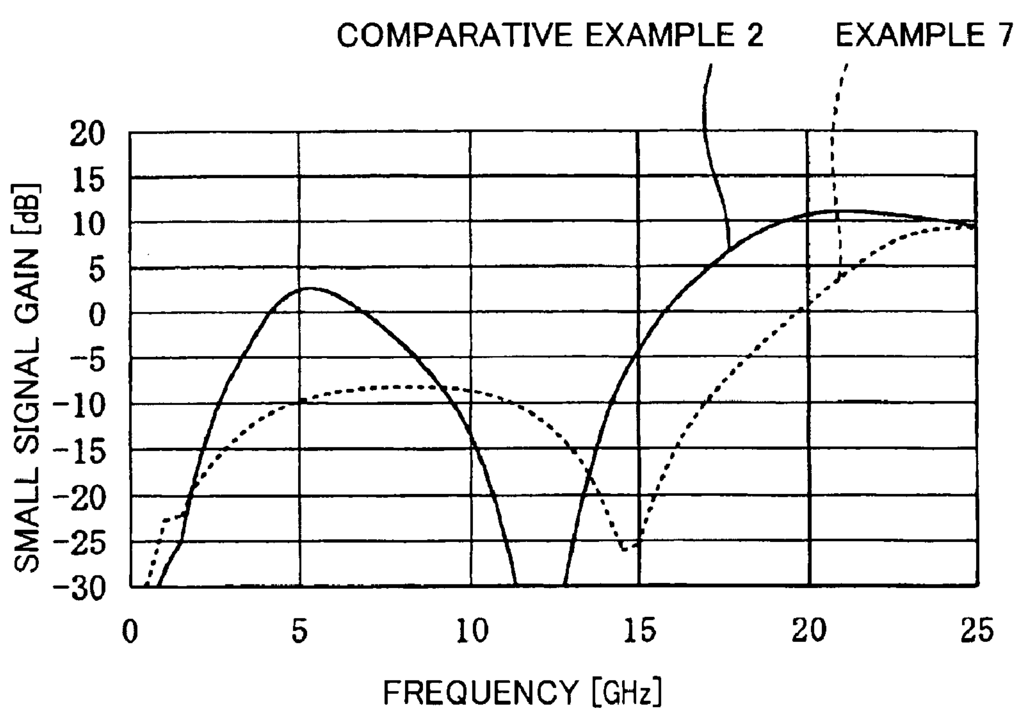
FIG. 17 is a graph showing a comparison between the high frequency amplifier of Example 7 according to the fourth embodiment of the present invention and the high frequency amplifier of Comparative Example 2 in terms of a frequency dependence of a small signal gain.

FIG. 17 is a graph showing a comparison between the high frequency amplifier of Example 7 and the high frequency amplifier of Comparative Example 2 in terms of a frequency dependence of a small signal gain. In FIG. 17, a broken line indicates a characteristic of the amplifier of Example 7, while a solid line indicates a characteristic of the amplifier of Comparative Example 2.

As shown in FIG. 17, though an unnecessary gain is obtained in an unnecessary band of from 4 to 7 GHz, in the amplifier of Comparative Example 2, no positive value is obtained as a gain in a low frequency band lower than 19.5 GHz (unnecessary band) in the amplifier of Example 7. Thus, it is apparent that the advantageous effect of reducing unnecessary gain in low frequency band is achieved through the adaptation of the structure of this embodiment. Though a gain of 10 dB, which is larger than that obtained near the design frequency (25 to 27 GHz), is obtained near a frequency of 20 GHz in the amplifier of Comparative Example 2, a gain at 20 GHz in the amplifier of Example 7 is 0 dB. Thus, it is apparent that the advantageous effect of reducing unnecessary gain is achieved also in the band of 20 GHz through the adaptation of the structure.

COMPARATIVE EXAMPLE 3

Figure 24:
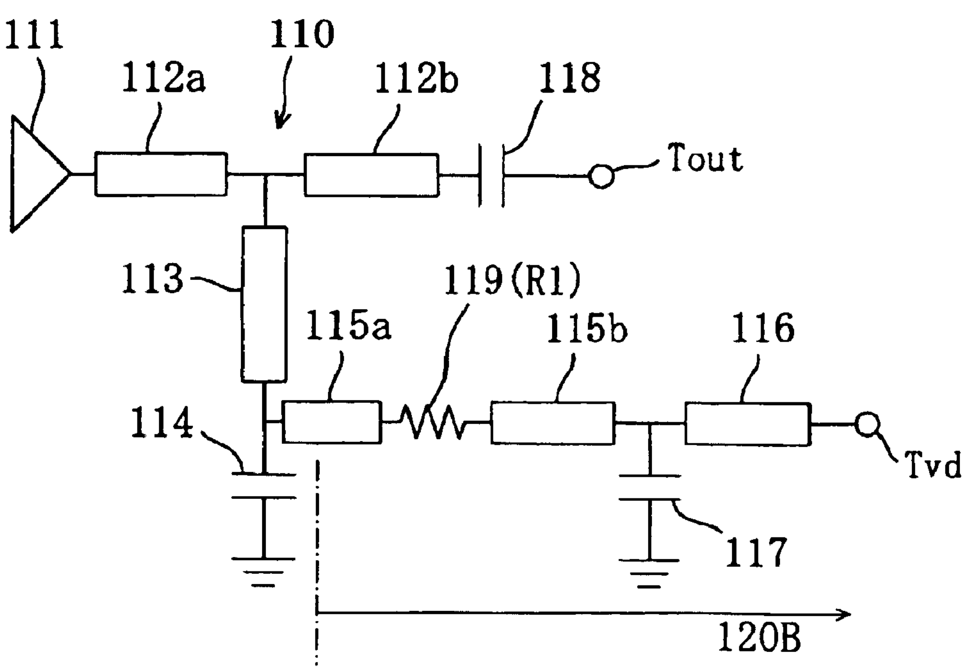
FIG. 24 is a circuit diagram showing a circuit structure of the output side of a high frequency amplifier of a second prior art in which a structure for reducing Q value of resonance is supplemented.

As the Comparative Example 3 according to this embodiment, a high frequency amplifier having the structure shown in FIG. 24 wherein a bias supplying circuit has a resistor 119 that is inserted serially in its bias supplying passage was fabricated. In this Comparative Example, in order to prevent a driving voltage of an active element from being reduced extremely, resistance of the resistor 119 was set to 20 Ω.

Figure 18:
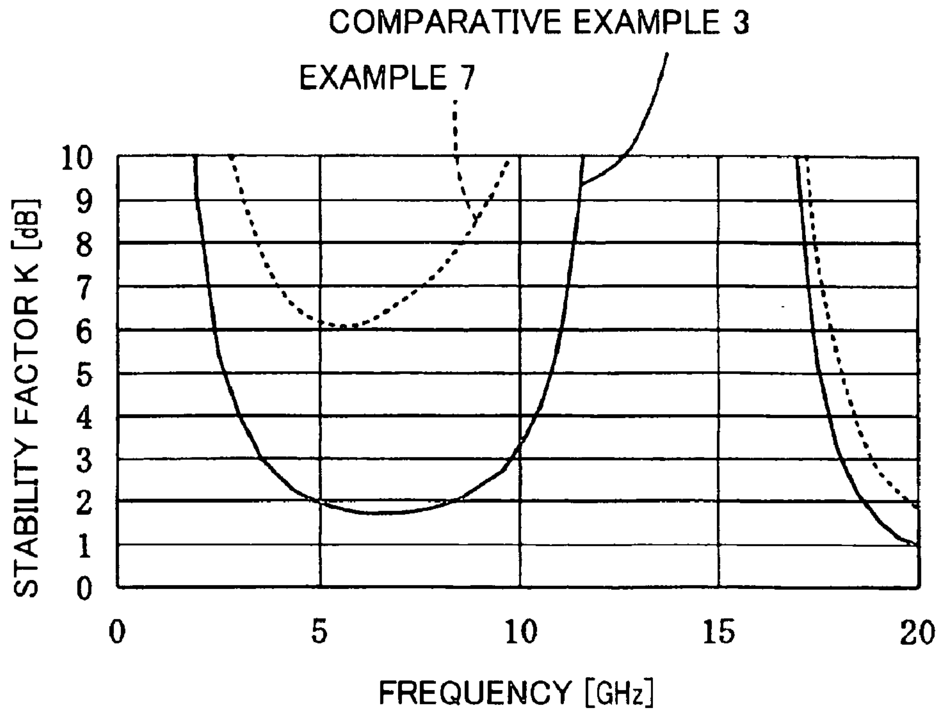
FIG. 18 a graph showing a comparison between the high frequency amplifier of Example 7 according to the fourth embodiment of the present invention and a high frequency amplifier of Comparative Example 3 in terms of a frequency dependence of a stability factor K.
Figure 19:
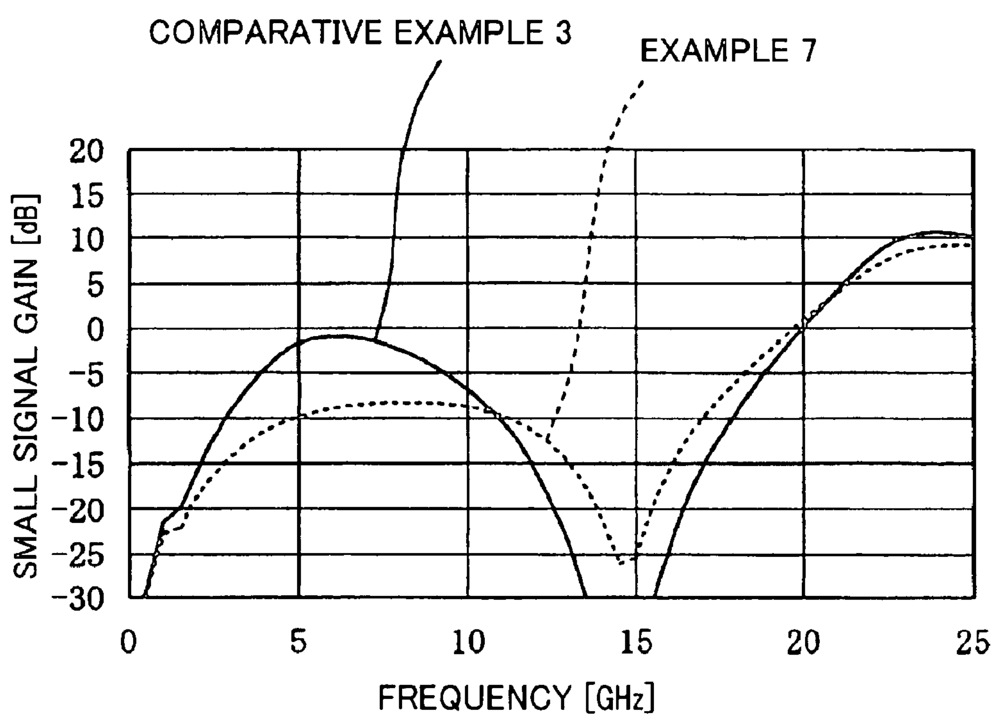
FIG. 19 is a graph showing a comparison between the high frequency amplifier of Example 7 according to the fourth embodiment of the present invention and the high frequency amplifier of Comparative Example 3 in terms of a frequency dependence of a small signal gain.

FIG. 18 is a graph showing a comparison between the high frequency amplifier of Example 7 and the high frequency amplifier of Comparative Example 3 in terms of a frequency dependence of a stability factor K, and FIG. 19 is a graph showing a comparison between the high frequency amplifier of Example 7 and the high frequency amplifier of Comparative Example 3 in terms of a frequency dependence of a small signal gain.

As shown in FIG. 18, the stability factor K of the amplifier of Comparative Example 3 is remarkably lower than the characteristic of the amplifier of Example 7 and deteriorated in stability in a low frequency band near 5 to 10 GHz and in a band of 20 GHz or more. Here, though the stability factor K of the amplifier of Comparative Example 3 at 5 to 10 GHz exceeds 1 to be free from a remarkable malfunction, the stability factor K is lower than 1 in the band of 20 GHz or more to cause a remarkable malfunction in stable operation.

In the amplifier of Comparative Example 3, the high frequency signal passing through the bias supplying circuit and leaking to the external circuits is attenuated in a broad band by a substantially constant value owing to the resistor 119 serially inserted in the bias supplying passage. In turn, in the bias supplying circuit 40 of Example 7, since the element attenuating the leaked signal of the high frequency signal is the distributed circuits (see FIG. 4B) distributed spatially along the region across which the signal strip 3 and the resistive layer 4 (see FIG. 1) are opposed to each other, an amount of the attenuation is increased with the increase in frequency of the leaked signal. Therefore, though it is difficult to improve the stability of the amplifier of Comparative Example 3 with respect to the highest frequency component of the leaked signal that is not short-circuited perfectly by the first bypass condenser 114 shown in FIG. 24, the amplifier of Example 7 easily achieves such improvement.

Though the effect of reducing unnecessary gain in low frequency band is achieved to a certain degree by the amplifier of Comparative Example 3, the small signal gain at 6 GHz was −1 dB. In the amplifier of Example 7, the small signal gain at this band was about −8 dB. Thus it was confirmed that the amplifier of Comparative Example 3 has difficulty in effectively suppressing the unnecessary gain under the condition that the resistance of the resistor 119 to be inserted cannot be set to a large value. It is needless to say that, when the resistance of the resistor 119 is set to a large value to achieve the effect of reducing unnecessary gain in the amplifier of Comparative Example 3 shown in FIG. 24, the voltage applied from the bias terminal Tvd to the active element 111 is lowered whereby to induce a reduction in output. A saturation output at 25 GHz of the amplifier of Comparative Example 3 is 16.2 dBm, and this saturation output is lower than that of the amplifier of Example 7 (16.6 dBm) by 0.4 dB. This is because the resistor 119 inserted in the bias supplying circuit in the Comparative Example 3 causes a reduction in driving voltage of the active element.

From the comparison between the characteristics of the amplifiers of Comparative Example 3 and Example 7 described above, it was proved that the advantageous effects of the reduction in unnecessary gain and the improvement in stability can be achieved without lowering the driving voltage of the active element through the use of the transmission line of the present invention.

COMPARATIVE EXAMPLE 4

As Comparative Example 4, a high frequency amplifier having the structure shown in FIG. 25 wherein a high frequency signal is short-circuited in parallel by the RC serial circuit 123 in the bias supplying circuit 120C was fabricated.

Figure 20:
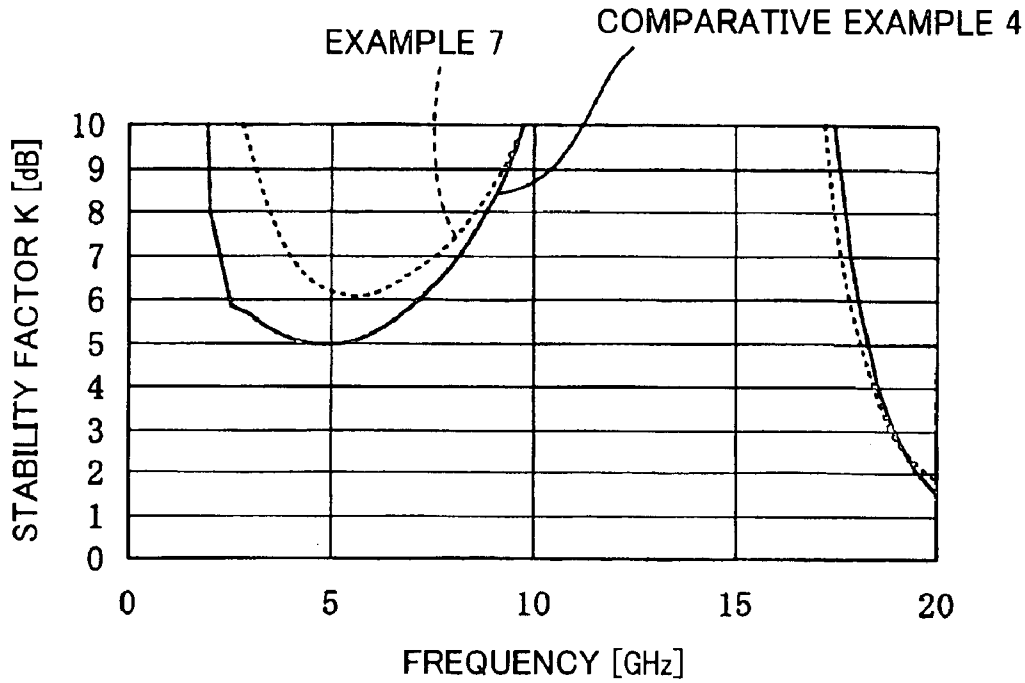
FIG. 20 is a graph showing a comparison between the high frequency amplifier of Example 7 according to the fourth embodiment of the present invention and a high frequency amplifier of Comparative Example 4 in terms of a frequency dependence of a stability factor K.

FIG. 20 is a graph showing a comparison between the high frequency amplifier of Example 7 and the high frequency amplifier of Comparative Example 4 in terms of a frequency dependence of a stability factor K, and FIG. 19 is a graph showing a comparison between the high frequency amplifier of Example 7 and the high frequency amplifier of Comparative Example 3 in terms of a frequency dependence of a small signal gain. In this Comparative Example, circuit constants of R=10 Ω and C=10 pF were selected for the RC serial circuit 123.

Figure 21:
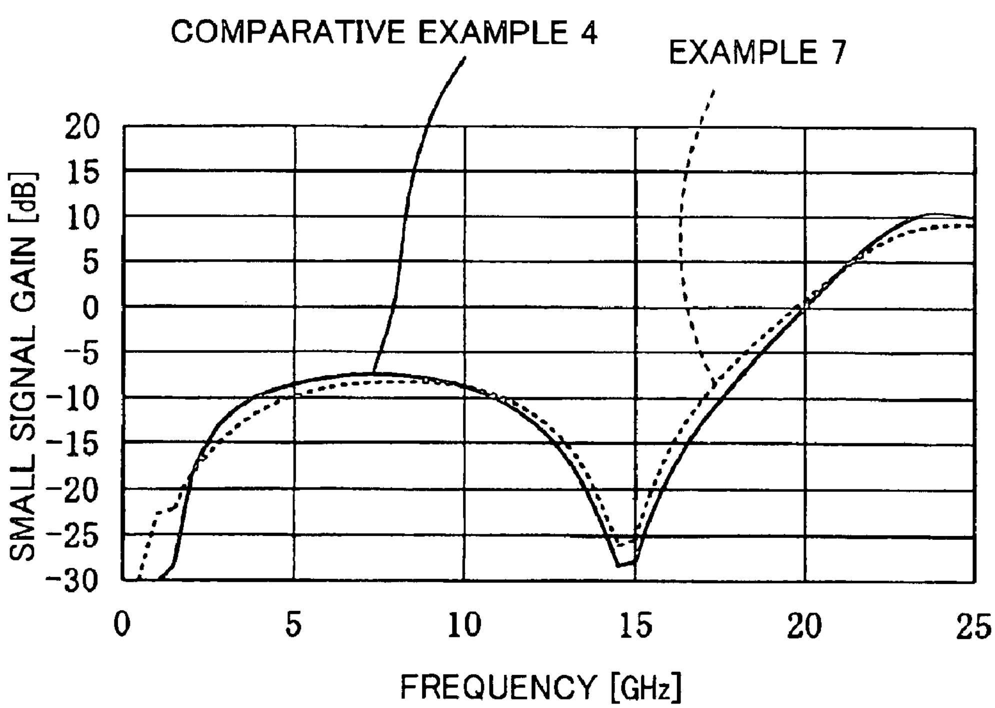
FIG. 21 is a graph showing a comparison between the high frequency amplifier of Example 7 according to the fourth embodiment of the present invention and the high frequency amplifier of Comparative Example 4 in terms of a frequency dependence of a small signal gain.

As shown in FIG. 21, an effect of suppressing a gain in a low frequency region was great also in Comparative Example 4. As shown in FIGS. 20 and 21, in the amplifier of Comparative Example 4, an effect similar to that of the amplifier of Example 7 was achieved with respect to the unnecessary gain suppression in a low frequency band of a several GHz and the improvement in stability. However, an area of 210 μm in square is required in the MIM capacitor (capacitor 122 shown in FIG. 15) in order to realizing the resistance of 10 Ω; a via hole (the via hole Hbi1 shown in FIG. 15) is further required in the short-circuiting circuit; and a circuit area sufficient for obtaining a capacitance value of 10 pF by a mesa resistor (the resistor 121 shown in FIG. 15) is required; to thereby largely limiting a circuit layout. On the other hand, in a layout of the amplifier of Example 7, limitation in the layout is moderated and, as compared with the amplifier of Comparative Example 4, the same effects are achieved by disposing the resistive layer 4 directly under the signal strip 3 with the dielectric film 2 disposed therebetween and disposing the via hole in the vicinity of the resistive layer 4.

In view of the above comparison, it was proved that the advantageous effects of reducing the unnecessary gain and improving the stability are achieved without increasing the circuit area of the semiconductor integrated circuit device constituting the amplifier by the use of the transmission line of the present invention.

Further, in the amplifier of Comparative Example 4, since the transmission line constituting the passage between the bypass condensers and the bias supplying circuit 120C is the ordinary microstrip that is formed on the circuit substrate constituted of the dielectric substrate and the dielectric film, the transmission line has a difficulty that a coupling with the peripheral circuits tends to occur due to the electric field distributed to an air layer on the top face of the substrate and may entail oscillation that can be caused by the unwanted electromagnetic coupling between the circuits depending on an arrangement of the circuit components.

In contrast, in the second transmission line 36 (see FIG. 13) of the bias supplying circuit that characterizes the present invention, since the gap between the signal strip 3 and the resistive layer 4 is short, the characteristic impedance of the transmission line 36 is lowered and the electric field distribution is concentrated on the dielectric film 2, thereby enabling a large reduction in the electromagnetic coupling with the peripheral circuits. Thus, in the amplifier of Example 7, an advantageous effect of keeping the high frequency characteristic unchanged even with the change in the arrangement of the circuit components is attained.

In view of the above comparison, it was proved that the advantageous effects of reducing unnecessary gain and improving stability without lowering the driving voltage of the active element can be achieved without increasing the circuit area too much through the use of the transmission line of the present invention.

EXAMPLE 7b AND COMPARATIVE EXAMPLES 2b TO 4b

As Example 7b according to the present embodiment, a two-stage amplifier having the structure of the amplifier of Example 7 and using the bias supplying circuit of Example 7 as bias supplying circuits for driving active elements of a front stage and a rear stage was fabricated.

As Comparative Examples 2b to 4b, two-stage amplifiers respectively having the structures of the amplifiers of Comparative Examples 2 to 4 and using the bias supplying circuits of Comparative Examples 2 to 4 as bias supplying circuits were fabricated. The bias supplying circuits of each of the two-stage amplifiers are used for driving active elements of a front stage and a rear stage.

Oscillation occurred in the amplifiers of Comparative Examples 2b and 3b at 20 GHz, but not in the amplifiers of Example 7b and Comparative Example 4b. A phase of a signal (feedback signal) that is output from the rear stage active element of the two-stage amplifier and retuned to the front stage active element through the bias supplying circuit shared inside the amplifier depends on a sum of electric lengths of short stubs in the front and the rear stages and a sum of electric lengths of the transmission lines of the bias supplying circuit of each of the stages. In the amplifiers of Example 7b and Comparative Examples 2b to 4b, the sum of the electric lengths was close to a half wavelength with respect to 20 GHz, so that the amplifiers were under the condition that the output from the rear stage active element was input to the front stage active element in a positive feedback phase. It can be understood that the oscillation in Comparative Example 2b occurred because the positive feedback signal was not attenuated at all. Further, it can be understood that the oscillation occurred in the amplifier of Comparative Example 3b because an amount of the attenuation of the positive feedback signal was insufficient in the bias supplying circuit.

In turn, it can be understood that since both of the amplifiers of Example 7b and Comparative Example 4b have a function of causing a loss to the signal of the unnecessary frequency band leaking to the bias supplying circuits though they are different in structure, the feedback signal from the rear stage active element to the front stage active element is attenuated, so that oscillation did not occur in the amplifiers of Example 7b and Comparative Example 4b. When the amplifier of Example 7b and the amplifier of Comparative Example 4b are compared with each other in terms of the area occupied by the circuit, the amplifier of Comparative Example 4b needs to be provided with a large capacitance (10 pF) bypass condenser in each of the front stage and the rear stage whereby to require a large circuit area, while the amplifier of Example 7b does not require any large capacitance condenser and attains the advantageous effect of the present invention of securing stable operation with achieving a reduction in space.

Consequently, by the use of the transmission line of the present invention as the bias supplying circuit in a semiconductor integrated circuit device such as an amplifier, it is possible to achieve advantageous effects of reducing unnecessary gain and improving stability without reducing a driving voltage of the active element while suppressing an increase in space for the semiconductor integrate circuit device and a characteristic change caused by an impedance change in the external bias supplying circuit provided outside the semiconductor integrated circuit to which the bias supplying circuit is connected.

Particularly, the semiconductor integrated circuit device of the present invention largely contributes to enhancing the application of the semiconductor integrated circuit device to a millimeter wave communication system.

Though the GaAs substrate is used as the dielectric substrate in the first to third embodiments that include Examples 1 to 7, the present invention is not limited to the above embodiments, and a GaN substrate or an InP substrate may be used as the dielectric substrate. Alternatively, an insulating substrate formed from an oxide may be used as the dielectric substrate. Further, the words "dielectric substrate" and "semiconductor substrate" are not necessarily used in a strict sense. The GaAs substrate is sometimes called "semi-insulating substrate" and functions as a semiconductor substrate when it is doped with impurity. Thus, as the substrate of the present invention, various substrates may be used depending on a basic structure of the high frequency line.

From the foregoing description, various modifications and embodiments are apparent for person skilled in the art. Therefore, the foregoing description should be understood as examples and are presented for the purpose of teaching the person skilled in the art the best mode for carrying out the present invention. It is possible to substantially change the structure and/or the details of the function of the present invention without departing from the spirit of the invention.

What is claimed is:

1. A transmission line comprising:

a signal strip;

a resistive layer opposed to the signal strip with a dielectric layer disposed between the resistive layer and the signal strip; and a ground conductor electrically connected to the resistive layer, wherein, a high frequency current is induced in the resistive layer through capacitance formed by the dielectric layer between the signal strip and the resistive layer when a high frequency signal of a predetermined frequency is transmitted through the signal strip, and when resistance per unit length generated when the high frequency current flows in the resistive layer, and between the resistive layer and the ground conductor, is defined as an additional resistance, and resistance per unit length generated when the high frequency current flows through the ground conductor is defined as a ground resistance, the additional resistance is larger than the ground resistance, wherein a width of the resistive layer is larger than a width of the signal strip, the resistive layer is formed such that the whole width thereof is opposed to the signal strip, the signal strip is formed on a top face of the dielectric layer, the resistive layer is formed between a substrate and the dielectric layer, the ground conductor is formed on a bottom face of the substrate, and the resistive layer is connected to the ground conductor via a penetrating conductor penetrating the substrate.

2. The transmission line according to claim 1, wherein a length of the resistive layer is 1/16 or more of an effective wavelength $\lambda$ of a signal of an upper limit frequency of the high frequency signal.

3. The transmission line according to claim 1, wherein conductivity of a material constituting the resistive layer is smaller than conductivity of the ground conductor.

4. The transmission line according to claim 1, wherein the penetrating conductor is formed on an edge of the resistive layer.

5. The transmission line according to claim 1, wherein a plurality of the penetrating conductors are formed along a longitudinal direction of the resistive layer with a spacing.

6. The transmission line according to claim 1, wherein the resistive layer is formed from at least one material selected from the group consisting of chrome, nickel chrome alloy, iron-chrome alloy, thallium, a chrome-silicon oxide composite, titanium, an impurity doped semiconductor, and polycrystalline or amorphous semiconductors formed by polysilicon or the like.

7. The transmission line according to claim 1, wherein the conductivity of the material constituting the resistive layer is in the range of $1\times10^3$ S/m or more and $1\times10^7$ S/m or less.

8. The transmission line according to claim 7, wherein the conductivity of the material constituting the resistive layer is in the range of $1\times10^3$ S/m or more and $1\times10^5$ S/m or less.

9. A semiconductor integrated circuit device comprising:

a main signal circuit on which at least one active element is disposed; and a bias supplying circuit having a transmission line and supplying bias to the main signal circuit through the transmission line, wherein at least a part of the transmission line is the transmission line according to claim 1.

10. The semiconductor integrated circuit according to claim 9, wherein the transmission line has a first transmission line connected to the main signal circuit and a second transmission line connected to the first transmission line;

the first transmission line is formed by a coplanar waveguide or a microstrip;

the second transmission line is formed by the at least a part of the transmission line; and an end of the first transmission line closer to the main signal circuit is connected to a ground terminal through a bypass condenser.

11. The semiconductor integrated circuit according to claim 9, wherein the semiconductor integrated circuit device is a single-stage high frequency amplifier having an amplifying transistor as the at least one active element; and the bypass supplying circuit is at least one of an input side circuit that is of a front stage side with respect to the active element of the main signal circuit and an output circuit that is of a rear stage side with respect to the active element of the main signal circuit.

12. The semiconductor integrated circuit according to claim 11, wherein the semiconductor integrated circuit device is a multi-stage high frequency amplifier having a plurality of amplifying transistors as the at least one active element; and the bypass supplying circuit is at least one of an input side circuit that is of a front stage side with respect to the active element of the main signal circuit, an output circuit that is of a rear stage side with respect to the active element of the main signal circuit, and an inter-stage circuit that is disposed between the plurality of amplifying transistors.

* * * * *